(12) United States Patent
Kishimoto

(10) Patent No.: US 11,096,292 B2
(45) Date of Patent: Aug. 17, 2021

(54) DISPLAY APPARATUS AND METHOD FOR MANUFACTURING DISPLAY APPARATUS

(71) Applicant: SAKAI DISPLAY PRODUCTS CORPORATION, Sakai (JP)

(72) Inventor: Katsuhiko Kishimoto, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 0 days.

(21) Appl. No.: 15/931,411

(22) Filed: May 13, 2020

(65) Prior Publication Data
US 2020/0275559 A1    Aug. 27, 2020

Related U.S. Application Data

(62) Division of application No. 16/342,921, filed as application No. PCT/JP2017/046186 on Dec. 22, 2017, now Pat. No. 10,694,626.

(51) Int. Cl.
*H05K 5/00* (2006.01)
*B60R 11/00* (2006.01)
*B60R 11/02* (2006.01)
*B60R 16/023* (2006.01)
(Continued)

(52) U.S. Cl.
CPC ............ *H05K 5/0017* (2013.01); *B60R 11/00* (2013.01); *B60R 11/0235* (2013.01);
(Continued)

(58) Field of Classification Search
CPC ...... H05K 5/0017; H05K 1/181; H05K 3/323; H05K 2201/10128; H05K 2201/10606;
(Continued)

(56) References Cited

U.S. PATENT DOCUMENTS 6,296,493 B1 * 10/2001 Michiya ................. H05K 3/325
439/66
2001/0033347 A1    10/2001 Kitahora et al.
(Continued)

FOREIGN PATENT DOCUMENTS

JP    H02-081575 A    6/1990
JP    H10-333597 A    12/1998
(Continued)

*Primary Examiner* — Pete T Lee
(74) *Attorney, Agent, or Firm* — ScienBiziP, P.C.

(57) ABSTRACT

A display apparatus comprises a display panel comprising a plurality of driving elements to drive pixels and a first terminal group electrically connected to the driving elements; a supporting member comprising a surface on which the display panel is to be placed and comprising, on the surface, a plurality of wirings and a second terminal group connected to the plurality of wirings; and a holding member provided along an edge of the display panel using a rod-shaped material having a linear or curved shape to hold the display panel at a given position on the surface of the supporting member, wherein the first terminal group is provided on a surface of the display panel to be directed to the supporting member; and the display panel is placed on the surface of the supporting member, and each of terminals constituting the first terminal group is connected to each of terminals constituting the second terminal.

10 Claims, 9 Drawing Sheets

(51) Int. Cl.
*H05K 1/18* (2006.01)
*H05K 3/32* (2006.01)
*H01L 27/32* (2006.01)

(52) U.S. Cl.
CPC ........... *B60R 16/023* (2013.01); *H05K 1/181* (2013.01); *H05K 3/323* (2013.01); *B60R 2011/0026* (2013.01); *H01L 27/3244* (2013.01); *H05K 2201/10128* (2013.01); *H05K 2201/10606* (2013.01); *H05K 2203/082* (2013.01)

(58) Field of Classification Search
CPC .............. H05K 2203/082; B60R 11/00; B60R 11/0235; B60R 16/023; B60R 2011/0026; H01L 27/3244
See application file for complete search history.

(56) References Cited

U.S. PATENT DOCUMENTS

| | | | |
|---|---|---|---|
| 2006/0109614 A1* | 5/2006 | Lee | H01L 51/524 361/679.21 |
| 2008/0088766 A1 | 4/2008 | Chang et al. | |
| 2012/0248950 A1 | 10/2012 | Niibori | |
| 2015/0208529 A1* | 7/2015 | Sakong | G06F 1/1601 361/679.01 |

FOREIGN PATENT DOCUMENTS

| | | |
|---|---|---|
| JP | 2000-502471 A | 2/2000 |
| JP | 2001-265251 A | 9/2001 |
| JP | 2002-258318 A | 9/2002 |
| JP | 2006-146214 A | 6/2006 |
| JP | 2006-171601 A | 6/2006 |
| JP | 2008-083378 A | 4/2008 |
| JP | 2008-097012 A | 4/2008 |
| JP | 2009-111254 A | 5/2009 |
| JP | 2010-014764 A | 1/2010 |
| JP | 2011-107321 A | 6/2011 |
| JP | 2012-156913 A | 8/2012 |
| JP | 2012-209133 A | 10/2012 |
| JP | 2012-215621 A | 11/2012 |
| JP | 2016-097650 A | 5/2016 |
| JP | 2016-134548 A | 7/2016 |
| WO | 1998/015872 A1 | 4/1998 |
| WO | 2016/194323 A1 | 12/2016 |

* cited by examiner

DISPLAY APPARATUS AND METHOD FOR MANUFACTURING DISPLAY APPARATUS

TECHNICAL FIELD

The present invention relates to a display apparatus and a method for manufacturing display apparatus.

BACKGROUND ART

Display panels formed using a resin film or a thin glass plate as a base material are recently used for flat panel display apparatuses such as organic-EL display apparatuses and liquid crystal display apparatuses to satisfy requirements for thinning. In many display apparatuses, a thin display panel comprising a very thin material such as a resin film as a base material is laminated on a surface of an arbitrary support to assure shape retainability or mechanical strength suitable for the purpose of use. For example, Patent Document 1 discloses a digital signage comprising an image display panel laminated on a glass plate. In Patent Document 1, a display surface of the image display panel is substantially thoroughly laminated to a window glass via a layer containing a photocuring resin.

PRIOR ART DOCUMENT

Patent Document

Patent Document 1: JP 2016-97650 A

SUMMARY OF THE INVENTION

Problem to be Solved by the Invention

It is very difficult to remove a display panel from a support when the display panel is adhered to the support substantially thoroughly at a display surface or an opposite surface thereof using an adhesive containing a photocuring or thermosetting resin as disclosed in Patent Document 1. Therefore, for example, when a defect occurs in either one of the display panel and the support, it is considered that continuously using the other one thereof that maintains normal functions or reusing the display panel or the support in another apparatus is difficult. Further, according to the laminating method disclosed in Patent Document 1, it is difficult to accurately laminate the display panel to a given position on the glass plate. In addition, it is necessary to separately prepare means for transmitting image signals to the display panel.

An object of the present invention is to provide a display apparatus where a display panel or a support thereof can be easily reused in the display apparatus or another display apparatus and which comprises means for transmitting signals to the display panel without impairing aesthetic appearance of the display apparatus. Further, another object of the present invention is to provide a method for manufacturing display apparatus capable of easily manufacturing a display apparatus, according to which reusing constituent elements is easy, a display panel is properly positioned, and means for transmitting signals to the display panel is provided so as not to impair aesthetic appearance of the display apparatus.

Means to Solve the Problem

A display apparatus according to one embodiment of the present invention comprises: a display panel comprising a plurality of driving elements to drive pixels and a first terminal group electrically connected to the driving elements; a supporting member comprising a surface on which the display panel is to be placed and comprising, on the surface, a plurality of wirings and a second terminal group connected to the plurality of wirings; and a holding member provided along an edge of the display panel using a rod-shaped material having a linear or curved shape to hold the display panel at a given position on the surface of the supporting member, wherein the first terminal group is provided on a surface of the display panel to be directed to the supporting member; and the display panel is placed on the surface of the supporting member, and each of terminals constituting the first terminal group is connected to each of terminals constituting the second terminal.

A method for manufacturing display apparatus according to another embodiment of the present invention comprises: forming a display panel comprising pixels, a plurality of driving elements to drive the pixels, and a first terminal group electrically connected to the plurality of driving elements; forming a plurality of wirings and a second terminal group connected to the plurality of wirings on a surface of a supporting member, wherein the supporting member comprises the surface on which the display panel is to be placed; providing a holding member to hold the display panel on the surface, by adhering a rod-shaped material having a linear or curved shape onto the surface of the supporting member; causing at least a portion of an edge of the display panel to abut the rod-shaped material; and placing the display panel on the surface of the supporting member, wherein placing the display panel on the surface of the supporting member comprises placing the display panel on the surface while directing the first terminal group to the surface, and connecting each of terminals constituting the first terminal group and each of terminals constituting the second terminal group.

Effects of the Invention

According to an embodiment of the present invention, the display panel or the supporting member can be easily reused in the display apparatus or another display apparatus, and the means for transmitting signals to the display panel can be provided without impairing aesthetic appearance of the display apparatus. Further, according to another embodiment of the present invention, it is possible to easily manufacture the display apparatus in which reusing constituent elements is easy, the display panel is properly positioned, and the means for transmitting signals to the display panel is provided without impairing aesthetic appearance of the display apparatus.

BRIEF DESCRIPTION OF THE DRAWINGS

FIG. 7A shows an example of the display apparatus according to Embodiment 1 in which spaces between the display panel and both of the holding member and the supporting member are covered with a resin, or the like.

EMBODIMENT FOR CARRYING OUT THE INVENTION

Figure 1:
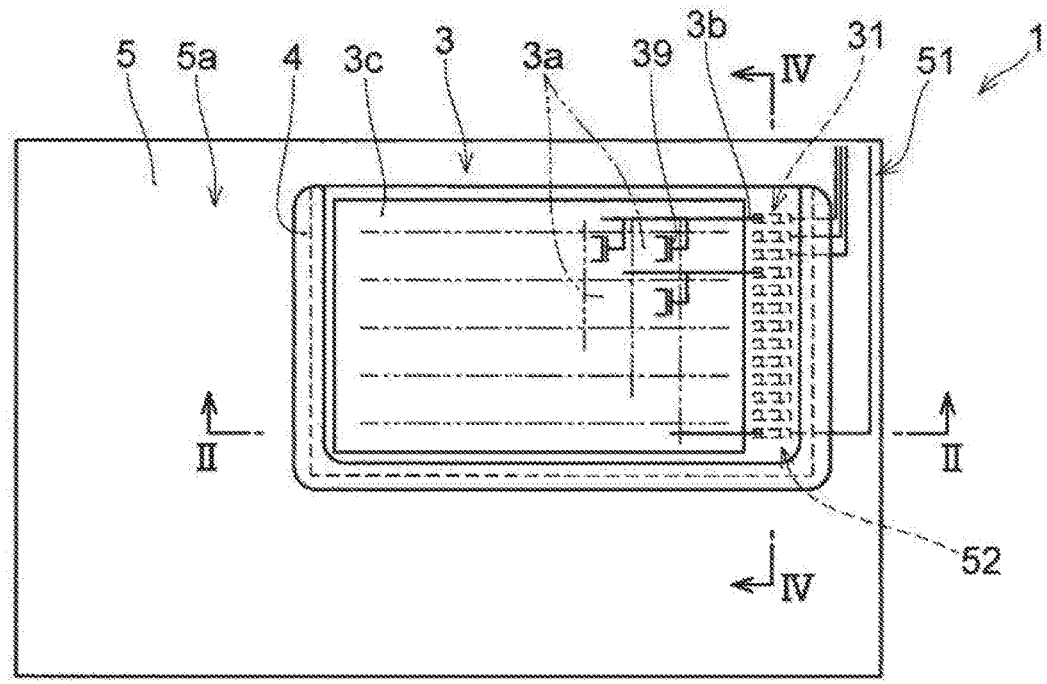
FIG. 1 shows a front view of one example of a display apparatus according to Embodiment 1 of the present invention.
Figure 1:
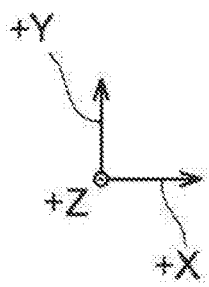

The inventor of the present invention has intensively studied structures for a display apparatus comprising a display panel fixed to the surface of a support, which can realize the reuse of the defect-free display panel or the defect-free support, in the case of the occurrence of a defect in a part of constituent elements. And, it has been found that employing a structure in which the display panel is fixed to the support via a member capable of holding the display panel at a given position on the support can appropriately fix the display panel to the surface of the support and can easily remove the display panel from the support as needed. In other words, the display panel is not adhered thoroughly to the support by means of an adhesive and engages with the holding member that is configured to hold the display panel on the support, and the holding member is adhered to the support. Since the holding member restricts the movement of the display panel relative to the support, the display panel can be fixed to the given position on the surface of the support. In addition, when the display panel is removed from the support, the display panel can be easily removed from the support by separating the holding member and the display panel that are not mutually adhered to and are simply engaged with each other.

Further, the inventor of the present invention has found that aesthetic appearance of the display apparatus can be improved by providing, on the support, wiring for transmitting a driving signal to be applied to the display panel held on the support. In other words, conventionally, although a flexible printed circuit (FPC) or the like has been mainly used as such wiring, the inventor of the present invention has found a problem of preventing the aesthetic appearance of the display apparatus from being impaired by the wiring such as FPC and also found the solution to the problem. In a conventional display apparatus, the FPC or the like constituting the wiring is connected at an edge thereof to the display panel, a driver that generates a driving signal, or the like. However, the FPC or the like is used in a state where an intermediate portion thereof is not fixed but floated in the air, and further in a state where it is deflected mainly toward a viewer of the display apparatus so that no tension is added. In conventional TV receivers, smartphones, and the like, the wiring such as the FPC is covered with a casing or the like and therefore cannot be seen by a viewer of the display apparatus. However, in a case where no casing is provided considering the ease of removing from the support, the FPC comprising a large number of wirings floated in the air in the periphery of the display panel, or a large number of wirings arranged in parallel with one another, is liable to be seen by a viewer of the display apparatus and, accordingly, can impair the aesthetic appearance of the display apparatus. For example, the wiring that shakes when subjected to vibrations spoils the view. In particular, in a case where the display apparatus is disposed in a relatively narrow space such as a vehicular compartment and a viewer in the vicinity thereof gazes at a display screen, such shakable wiring can deteriorate the appearance quality of the display apparatus.

On the other hand, by providing wirings on the support and using a structure in which the wirings and the display panel are connected, unshakable wiring can be orderly arranged at a position deeper than the display screen in a view from a viewer of the display apparatus. As a result, a neat impression can be given to a user, and the aesthetic appearance of the display apparatus can be improved although in the prior art there was a possibility that the aesthetic appearance was likely to be worsened by the wiring around the display panel.

Next, a display apparatus and a method for manufacturing display apparatus according to embodiments of the present invention will be described with reference to the drawings. Materials, shapes of the constituting elements, and their relative positions or the like according to the below-described embodiments are merely exemplary. The display apparatus and the method for manufacturing display apparatus according to the present invention are construed to be not limited thereto.

[Display Apparatus]

Figure 2:
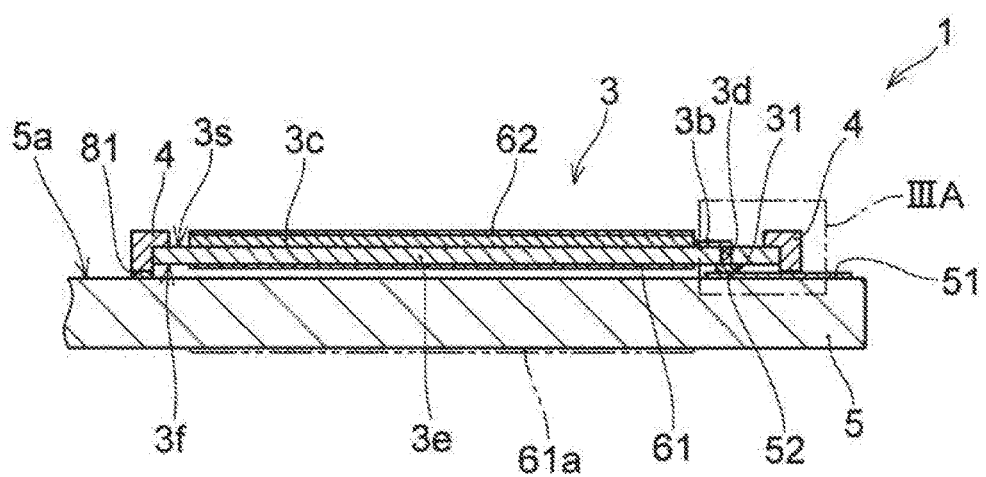
FIG. 2 shows a cross-sectional view along a line II-II in FIG. 1.
Figure 3A:
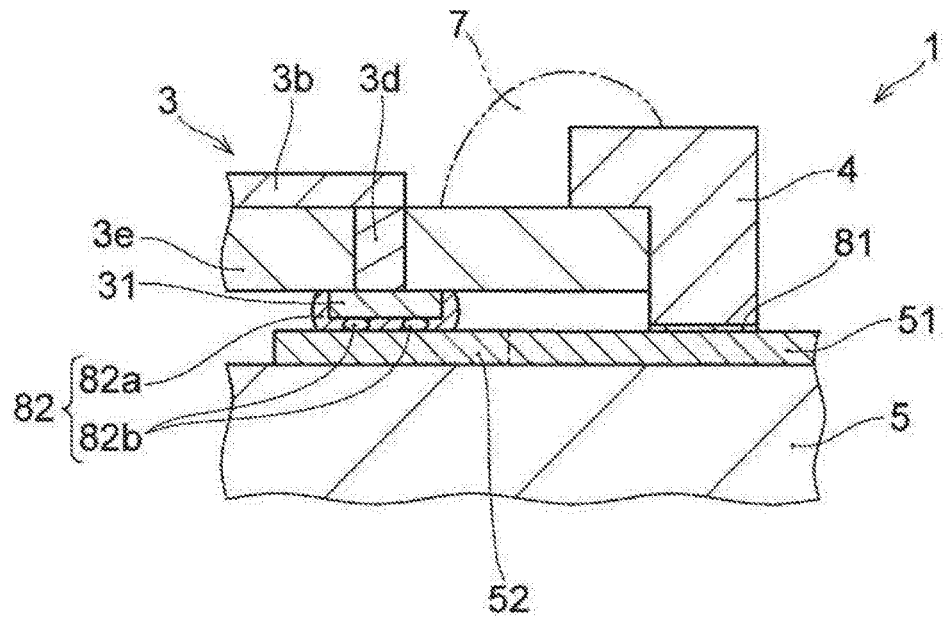
FIG. 3A shows an enlarged view of a IIIA portion in FIG. 2.

FIG. 1 shows a front view of a display apparatus 1 according to Embodiment 1, while FIG. 2 shows a cross-sectional view of the display apparatus 1 along a line II-II in FIG. 1. Moreover, FIG. 3A shows an enlarged view of a IIIA portion in FIG. 2. The display apparatus 1 comprises: a display panel 3 comprising a plurality of driving elements 39 to drive pixels 3a and a first terminal group 31 electrically connected to the driving elements 39; a supporting member 5 comprising a surface 5a on which the display panel 3 is to be placed and comprising, on the surface 5a, a plurality of wirings 51 and a second terminal group 52 connected to the plurality of wirings 51; and a holding member 4 provided along an edge of the display panel 3 using a rod-shaped material that has a curved shape, the holding member 4 is adhered onto the surface 5a of the supporting member 5. The holding member 4 holds the display panel 3 at a given position of the surface 5a of the supporting member 5. In the example in FIG. 1, the holding member 4 is a frame body that has a discontinuous portion on one side, and the frame body is formed using a rod-shaped material having a shape curved in a U-shape. The first terminal group 31 is provided on a surface (below, that is also called a first surface 3f) to be directed to the supporting member 5. The display panel 3 is placed on the surface 5a of the supporting member 5, and each of terminals constituting the first terminal group 31 is connected to each of terminals constituting the second terminal group 52.

In FIG. 2 and each of cross-sectional view that are referred to in the following explanations, each constituting element is emphatically drawn in the thickness direction of the display panel 3 as needed for ease of view of the first terminal group 31 and the second terminal group 52. Therefore, a space is produced between the display panel 3 and the supporting member 5 in FIGS. 2, 7B, and 8. However, as described later, the actual thickness of each terminal group can be approximately several μm, so that such a space may not exist. In other words, the display panel 3 can be in contact with the supporting member 5 in the majority of the first surface 3f of the display panel 3. Moreover, the space between the display panel 3 and the supporting member 5 can be filled with an arbitrary layered substance. For example, a weak adhesive layer (not shown) formed of an adherent material can be provided between the display panel 3 and the supporting member 5. By providing such a weak adhesive layer, the display panel 3 and the supporting member 5 can be brought into close contact with each other without causing any gap. Further, when the display panel 3 is removed from the supporting member 5, since the weak adhesive layer simply holds close contact, the display panel 3 can be easily peeled off the surface 5a. Such a weak adhesive layer comprises, for example, an adhesive agent, including an acrylic resin, a silicone resin, or a urethane resin, singly or in combination thereof, as a main component.

In the present embodiment, the display panel 3 engages with the holding member 4 at an edge thereof and is held at a given position of the surface 5a of the supporting member 5 by the holding member 4. However, the display panel 3 itself is not adhered to the supporting member 5 at portions of the first surface 3f excluding the first terminal group 31 and the surrounding thereof, or in other words, in the majority of the first surface 3f. Therefore, by only deadening an effect of the connecting means between the first terminal group 31 and the second terminal group 52 that is provided only at an extremely limited region corresponding to the first terminal group 31 and the surroundings thereof, it is possible to easily remove the display panel 3 from the supporting member 5. Therefore, in the case of the occurrence of a defect in the supporting member 5, the display panel 3 can be easily reused by removing the display panel 3 and combining it with another supporting member. Further, when the display panel 3 is broken, the supporting member 5 can be reused by removing the display panel 3 and placing another display panel.

Moreover, the first terminal group 31 connected to the driving elements 39 of the display panel 3 is connected to the second terminal group 52, and the second terminal group 52 is connected to the wirings 51. Therefore, the driving signal can be applied to the driving elements 39 by connecting conductive wires (not shown) connected to a driver (not shown) or the like to the wirings 51. In other words, it is unnecessary to arrange conventional wiring comprising FPC or the like in a state where it is floated in the air. The connection between the conductive wires connected to the driver (not shown) or the like and the wirings 51 can be performed at arbitrary positions of the wirings 51. For example, the connection can be performed at positions away from the display panel 3 (e.g., distal ends of the wirings 51 with respect to the display panel 3). Accordingly, the aesthetic appearance of the display apparatus 1 can be prevented from being impaired by the wiring such as the FPC extending from the display panel 3 toward the driver or the like.

In the example shown in FIGS. 1 to 3B, the display panel 3 has a rectangular front shape and has a pixel forming region 3c on a second surface 3s that is opposite the first surface 3f. In the pixel forming region 3c, a plurality of pixels 3a are formed so as to constitute a matrix pattern. The pixels 3a comprise the driving elements 39, and the driving elements 39 are connected to each of terminals constituting the first terminal group 31 via wirings 3b formed on the second surface 3s. The plurality of pixels 3a are merely shown schematically in FIG. 1, so that it is possible to form far more pixels 3a according to the screen size and the resolution of the display panel 3, compared to the example shown in FIG. 1. Further, each pixel 3a can comprise a plurality of driving elements 39. As an example of the display panel 3, an organic-EL display panel or a liquid crystal display panel is shown. In the cross-sectional view of FIG. 2 or the like, the pixel forming region 3c is shown so as to protrude from the surface (e.g., the second surface 3s in FIG. 2) of the display panel 3, as an example in which the display panel 3 is the organic-EL display panel. However, in the case where the display panel 3 is the liquid crystal display panel, the pixel forming region 3c does not necessarily have to protrude from the surroundings thereof on the surface of the display panel 3.

The display panel 3 has a margin portion, which is not occupied by the pixel forming region 3c, on the second surface 3s. In the example shown in FIG. 1, the display panel 3 has the margin portion in the vicinity of one side (a right side in FIG. 1) of the rectangular front shape, and the margin portion has a longitudinal direction along the one side. The plurality of terminals constituting the first terminal group 31 is arrayed along the longitudinal direction of a portion, being opposed to the margin portion, on the first surface 3f. For example, each terminal constituting the first terminal group 31 has a width approximately 50 μm or more and approximately 300 μm or less in the array direction and can be arrayed at a pitch approximately 100 μm or more and approximately 600 μm or less. Further, for example, each terminal constituting the first terminal group 31 can have a thickness 5 μm or more and 30 μm or less. However, the width, the array pitch, and the thickness of each terminal constituting the first terminal group 31 are not construed to be limited to the above-mentioned values. As shown in FIGS. 2 and 3A, each of the terminals constituting the first terminal group 31 and the wirings 3b formed on the second surface 3s are connected via through-hole conductors 3d. The region that is surrounded by the chain double-dashed line and is provided with a reference numeral 7 in FIG. 3A shows a sealing member to be described later.

The wirings 3b can be formed using a light-blocking metal such as copper or nickel, or a light-transmitting conductive material such as indium tin oxide (ITO) or indium zinc oxide (IZO). Moreover, each of the terminals constituting the first terminal group 31 is formed of the same materials as those of the wirings 3b and, further, it is preferable to comprise a coating layer using a gold plating film on a conductor pattern formed of these materials. This is because there is no formation of a natural oxide film and an excellent electrical connection is maintained even when, accompanied by a replacement of the supporting member 5, attachment and/or detachment is made with the second terminal group 52. The through-hole conductor 3d can be formed by filling a through hole, formed at a substrate 3e which constitutes the display panel 3, with copper or nickel.

The supporting member 5 is not construed to be particularly limited with respect to the shape and material, as long as it can appropriately support the display panel 3. The supporting member 5 is preferably formed using a material that can constitute the surface 5a, on which the wirings 51 can be directly formed with sufficient adhesive strength. However, as described below, the wirings 51 can be formed in advance on a separate base material 50 (see FIG. 6) and then adhered to the surface 5a. Accordingly, the supporting member 5 is not necessarily required to enable the wirings 51 to be directly formed on the surface 5a. The supporting member 5 can be formed of an arbitrary material, such as glass, a metal, or a synthetic resin. Further, the supporting member 5 can be a glass plate that is used as a casing applicable to various devices, a windowpane of a residence, a shop window, or a display case. Further, the supporting member 5 can be constituted by a window glass for a vehicle, such as an automobile or a train. In that case, the surface 5a is, for example, a surface of the windshield of an automobile or the like, which is directed toward a vehicular compartment. Further, the surface 5 can be a flat surface, or can be a curved surface having an arbitrary curvature.

In the case where the supporting member 5 is a windshield of an automobile, the wirings 51 are preferably provided within an area to be an upper 20% region of a projection image of the windshield projected on a plane orthogonal to the back-and-forth direction of the automobile. Further, in the case where the wirings 51 are formed of a light-shielding metal material such as copper described below, it is preferable that no light-shielding member be present between wirings each of which is one of the plurality of wirings 51, or, in other words, it is preferable that the windshield be exposed between wirings each of which is one of the plurality of wirings 51. By doing so, the forward field of vision during driving can be sufficiently secured, and it is possible to contribute to safe navigation. "The windshield be exposed" means the state where the windshield can be visually recognized by a person in the vehicular compartment, and, as a result, the person in the vehicular compartment can look forward through the windshield. Accordingly, for example, "the windshield be exposed" includes a state where the windshield is covered with a transparent resin between the wirings 51 (or together with the wirings 51), in addition to a state where there is no object physically covering the windshield. By covering the windshield with the resin between the wirings 51 as mentioned above, the penetration of moisture from the interface between the wirings 51 and the windshield can be prevented and the windshield can be protected from an external mechanical stress. Further, it is possible to reduce unevenness on the surface of the windshield caused by the wirings 51.

A conductive paste including silver or the like, copper, titanium, aluminum, ITO, IZO, and the like are exemplary materials for the wirings 51 and the second terminal group 52. Further, similar to the above-mentioned first terminal group 31, it is preferable for the second terminal group 52 to comprise a coating layer made of a gold plating film on a conductor pattern formed of such a material. This is because an excellent electrical connection is maintained even when, accompanied by a replacement of the display panel 3, attachment and/or detachment is made with the first terminal group 31. When the supporting member 5 is formed of a light-transmitting material such as glass, it is preferable to form at least wirings 51 by a material that can transmit light, such as ITO and IZO, so as not to prevent light transmission. The wirings 51 and the second terminal group 52 are respectively formed to have a thickness of, for example, approximately 1 μm or more and approximately 300 μm or less. However, the thicknesses of the wirings 51 and the second terminal group 52 are not construed to be limited to the above-mentioned range.

The second terminal group 52 is formed at a position facing the first terminal group 31 when the display panel 3 is positioned at the given position on the surface 5a. In the example shown in FIG. 1, the plurality of terminals constituting the second terminal group 52 is arranged in a row at the same pitch as the array pitch of each of terminals constituting the first terminal group 31.

Members of the plurality of wirings 51 are parallel to each other and extend from the second terminal group 52 toward the edge of the supporting member 5. In the example shown in FIG. 1, the wirings 51 extend from the second terminal group 52 toward the outside of the display panel 3 in a direction orthogonal to the array direction of the second terminal group 52 and, via substantially right-angled crooked portions, extend toward the edge of the supporting member 5 which is along the direction orthogonal to the array direction of the second terminal group 52. Although not shown, preferably, the wirings 51 can comprise connecting portions with the conductive wires connected to the driver (not shown), preferably, at a distal end from the second terminal group 52. From the viewpoint of keeping such connecting portions away from the display panel 3 so that they are not easily seen by a viewer of the display panel 3, it is preferable that the wirings 51 extend from the second terminal group 52 toward the edge of the supporting member 5, particularly toward the edge of the supporting member 5 remote from the display panel 3. On the other hand, in the case where the conductor resistance of the wirings 51 is relatively large, it can be preferable for the wirings 51 to extend toward an end of the supporting member 5 which is in the vicinity of the display panel 3. In that case, it is preferable that the display panel 3 be placed at an edge part of the supporting member 5. When the supporting member 5 has a rectangular shape of the surface 5a, the display panel 3 is preferably placed at a corner portion of the surface 5a of the supporting member 5. The placement of the display panel 3 at the corner portion of the supporting member 5 is also desirable in that the display panel 3 itself cannot be easily seen by a person when no image is displayed. The route of each one of the plurality of wirings 51 is not construed to be limited to the example shown in FIG. 1. Further, the wirings 51 can be covered with a protection film formed of polyester or polyethylene terephthalate (PET).

The holding member 4 is engaged with the edge of the display panel 3 and is adhered to the surface 5a of the supporting member 5 by means of the adhesive 81. The holding member 4 is provided at a part or the whole of the edge of the display panel 3. In the example shown in FIG. 1, the holding member 4 is provided along three sides of the display panel 3 having a rectangular front shape, and the holding member 4 has a front shape like a U-shape. As shown in FIG. 2, the holding member 4 has a substantially L-shaped cross section at each side of the U-shape and abuts the side surface and the second surface 3s of the display panel 3 at two surfaces to which each of two sides directed to inside the L-shaped cross section belongs.

The movement of the display panel 3 is restricted by the holding member 4 in both positive and negative directions in the X direction (the longitudinal direction of the display panel 3), in −Y direction of the Y direction (the short-side direction of the display panel 3), and in a direction departing from the supporting member 5 (+Z direction) in FIG. 1. Therefore, the display panel 3 is held at a given position on the surface 5a of the supporting member 5 by the holding member 4. The movement of the display panel 3 in +Y direction can be restricted due to gravity by setting the −Y direction so as to coincide with the gravity direction at the time of use.

Unlike the example in FIG. 1, the holding member 4 can be provided over the entire periphery of the display panel 3 and have a frame-like front shape without including a discontinuous portion. Moreover, the holding member 4 can be provided only at an edge of one side or two sides of the display panel 3 having a rectangular shape, and, thus, can be formed with a linear rod-shaped material. It suffices that the holding member 4 restricts the movement of the display panel 3 to at least one direction on the surface 5a of the supporting member 5. Moreover, the holding member 4 having a frame-like front shape or a U-shaped front shape does not need to have a L-shape at the cross section of one side thereof and can have a U-shaped cross section having a groove at an inner wall surface directed to the display panel 3. An edge of the display panel 3 can be inserted into the groove. Alternatively, the inner wall surface of the holding member 4 that is directed to the display panel 3 can be a plane without any unevenness, in which case the movement of the display panel 3 in the direction departing from the supporting member 5 can be restricted by the frictional force acting between the display panel 3 and the wall surface.

In the example in FIG. 1, the holding member 4 is provided at an edge of the display panel 3 in the vicinity of the first terminal group 31 and one side of the holding member 4 having U-shape is overlaid on the wirings 51. However, when the holding member 4 has a discontinuous portion as in the example in FIG. 1, the discontinuous portion can face an edge of the display panel 3 in the vicinity of the first terminal group 31. In this case, the wirings 51 can be drawn out to the outside of the holding member 4 in a short path without overlaying the holding member 4 onto the wirings 51. Therefore, stress on the wirings 51 due to the holding member 4 can be eliminated.

Figure 3B:
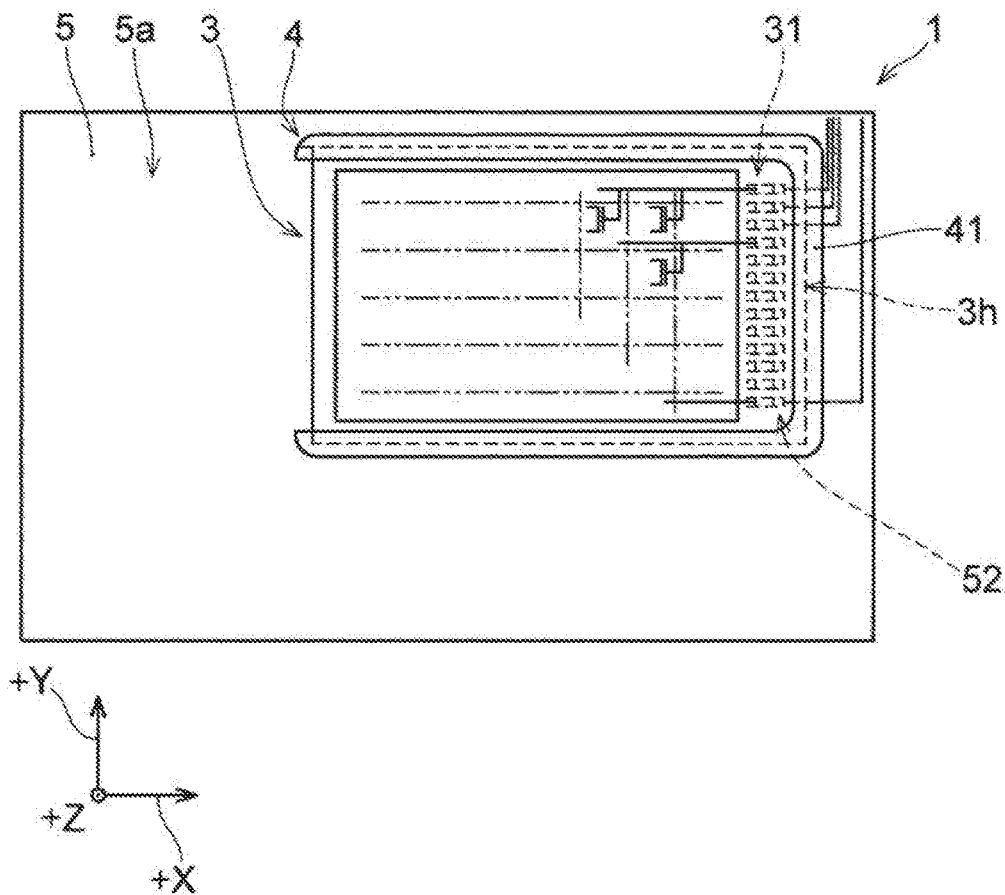
FIG. 3B shows a cross-sectional view of another example of a holding member of the display apparatus according to Embodiment 1.

Moreover, when the display panel 3 has a rectangular front shape and the holding member 4 is a frame body having a discontinuous portion at a portion of the whole rectangular shape, the discontinuous portion can face an edge opposite to an edge in the vicinity of the first terminal group 31 of the display panel 3 as exemplified in FIG. 3B. In other words, each of terminals constituting the first terminal group 31 is arranged along an arbitrary one side (a first side 3h being the right side in the example in FIG. 3B) and in the holding member 4 which is a frame body having a rectangular shape, a portion to be a side opposite to a side 41 abutting the first side 3h of the display panel 3 is a discontinuous portion. By providing the discontinuous portion as in the example in FIG. 3B, it is possible to prevent terminals not being connected to each other among the first terminal group 31 and the second terminal group 52 from uselessly rubbing against each other when inserting the display panel 3, via the discontinuous portion, into the interior of the frame-like holding member 4 already adhered to the supporting member 5 as described later. Therefore, even when repeating attachment and/or detachment of the display panel 3 to/from the holding member 4, friction of each terminal in the first terminal group 31 and the second terminal group 52 can be suppressed, and it is possible to maintain a proper connection state.

The holding member 4 can be formed of an arbitrary material capable of holding the display panel 3. For example, a synthetic resin such as an epoxy resin or a general-purpose plastic, a natural resin such as a natural rubber, and a rubber sponge are exemplary materials of the holding member 4. The holding member 4 is preferably formed of a material having flexibility and/or proper elasticity. In this case, the holding member 4 can be easily engaged with the display panel 3, and the display panel 3 can be placed on the supporting member 5 without entrainment of air bubbles. Moreover, it is preferable that it be difficult for a person viewing the display apparatus 1 to see the holding member 4, so that the holding member 4 is preferably formed using a light-transmitting material. From these points of view, it is especially preferable that the holding member 4 be formed using a transparent silicone rubber.

The adhesive 81 is not construed to be particularly limited as long as it can exhibit adhesive strength sufficient to stably join the holding member 4 to the supporting member 5. An arbitrary epoxy adhesive or an acrylic adhesive is usable. Further, a film-like or paste-type acrylic, silicone, or urethane adhesive, which can be referred to as an optical clear adhesive (OCA) or an optical clear resin (OCR), is usable.

Figure 4:
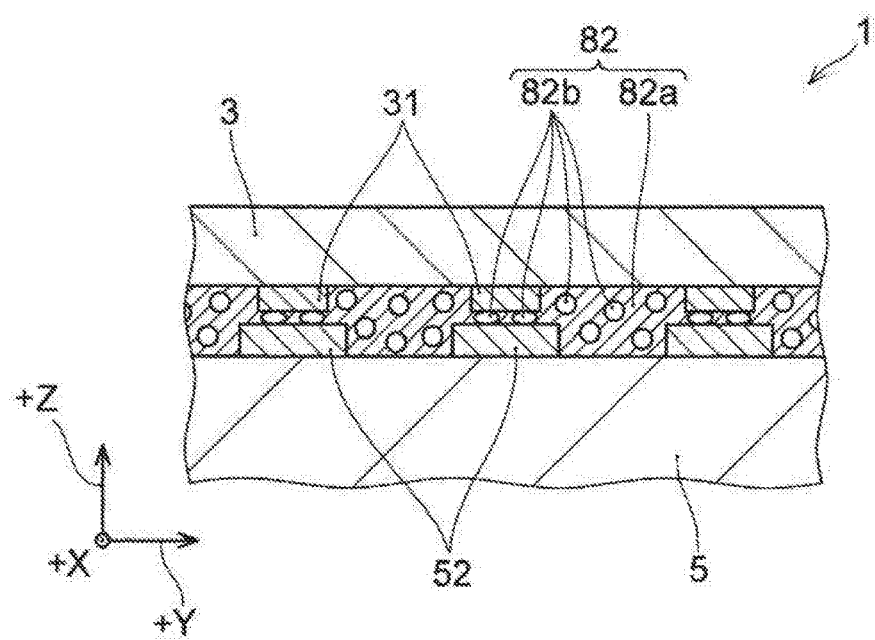
FIG. 4 shows an enlarged view of a portion of a cross section along a line IV-IV in FIG. 1.

The first terminal group 31 and the second terminal group 52 can be connected using an arbitrary conductive material. For example, an epoxy conductive adhesive or solder can be used. However, each terminal constituting either of the first terminal group 31 and the second terminal group 52 is provided with a pitch of several ten μm as described previously. Therefore, as shown in FIGS. 3A and 4, an anisotropic conductive film (ACF) is preferably used for a connecting means 82 connecting the first terminal group 31 and the second terminal group 52. FIG. 4 shows an enlarged view of a portion of a cross section along a line IV-IV in FIG. 1.

For example, the ACF includes a thermosetting resin portion 82a comprising an epoxy resin, a transparent acrylic resin or a transparent silicone resin and conductive particles 82b mixed into the thermosetting resin portion 82a. The thermosetting resin portion 82a, when heated and pressed, is once softened and then permanently hardened to constitute the connecting means 82 together with the conductive particles 82b. Although not shown, the conductive particle 82b comprises a metal layer made of nickel, gold, or the like so as to constitute a central part of the conductive particle 82b and an insulating layer covering the metal layer. When the ACF is heated and pressed in a state where the ACF is sandwiched between the first terminal group 31 and the second terminal group 52, the insulating layer is destroyed on each conductive particle 82b. The metal layers are brought into contact with each other, or the metal layer is brought into contact with each of the terminals. Therefore, a conductive path in the Z direction shown in FIG. 4 is formed between the first terminal group 31 and the second terminal group 52. On the other hand, since no sufficient pressure is applied to the conductive particles 82b in the thermosetting resin portion 82a not facing each of the terminals constituting these terminal groups, the insulating layer of the conductive particles 82b can be maintained, thus, the insulation property between the terminals in the Y direction in FIG. 4 can be maintained. As a result, each terminal of the first terminal group 31 formed with a narrow pitch and each terminal of the second terminal group 52 formed with a narrow pitch are electrically connected appropriately.

Referring back to FIG. 2, an optical functional layer 61 having a given function with respect to light propagation is formed on the surface (the first surface 3f) of the display panel 3 to be oriented to the supporting member 5. An ultraviolet-ray absorbing layer and an infrared-ray reflective layer are examples of the optical functional layer 61. Either or both of the ultraviolet-ray absorbing layer and the infrared-ray reflective layer can be formed on the first surface 3f of the display panel 3. As described above, the supporting member 5 can be a windshield of an automobile or the like. In that case, the first surface 3f of the display panel 3 is irradiated with sunlight that passed through the supporting member 5. However, for example, by providing the infrared-ray reflective layer on the first surface 3f, temperature increase of the display panel 3 due to the irradiation with sunlight can be suppressed. Accordingly, the display panel 3 can be prevented from deteriorating. In the case where the optical functional layer 61 comprises the infrared-ray reflective layer, the optical functional layer 61 can comprise a multilayered body composed of alternately deposited materials having mutually different refractive indices. The multilayers composed of materials having mutually different refractive indices, such as titanium oxide ($TiO_2$) and silicon dioxide ($SiO_2$), or zinc sulfide (ZnS) and magnesium fluoride ($MgF_2$), are formed to have a thickness capable of enhancing the reflected light in an infrared region at the interface of each layer.

Further, in the case where the display panel 3 is the organic-EL display panel, organic elements (not shown) in the display panel 3 can be subjected to stress due to ultraviolet-ray contained in sunlight. However, by providing the ultraviolet-ray absorbing layer as the optical functional layer 61, the stress due to the ultraviolet-ray that is imparted on the organic elements can be reduced. The ultraviolet-ray absorbing layer is formed of a resin, such as a polycarbonate resin or an acrylic resin, to which an ultraviolet-ray absorbing agent is added. As the ultraviolet-ray absorbing agents, a benzophenone derivative, a salicylate ester derivative, a triazole derivative, an acrylic derivative, or the like are exemplified.

As indicated by an alternate chain double-dashed line in FIG. 2, an optical functional layer 61a comprising an infrared-ray reflective layer and/or an ultraviolet-ray absorbing layer can be provided on a surface of the supporting member 5 that is opposite the surface 5a. When the optical functional layer 61a is provided at the supporting member 5, the optical functional layer 61a can be used continuously even when a defect or the like occurs and the display panel 3 is replaced. On the other hand, when the optical functional layer 61 is provided at the display panel 3, the optical functional layer 61 can also be replaced together with the display panel 3 in the case of functional deterioration of the optical functional layer 61 progressing according to temporal deterioration of the display panel 3. The optical functional layers 61 and 61a can be provided at the display panel 3 and the supporting member 5, respectively.

In the example shown in FIG. 2, a protection film 62 against a mechanical stress is further formed on the surface of the pixel forming region 3c of the display panel 3, or, in other word, on a display surface of the display panel 3. The surface of the pixel forming region 3c is exposed toward a viewer of the display apparatus 1 and therefore tends to be subjected to a mechanical stress due to collision of a foreign object or wiping operation at the time of contaminations. The protection film 62 protects the display panel 3, particularly pixels in the pixel forming region 3c, against such a mechanical stress. As the protection film 62, an inorganic film such as an $SiO_2$ film or a fluorine film, and an organic resin film formed of polyester or polyethylene terephthalate (PET).

Figure 5A:
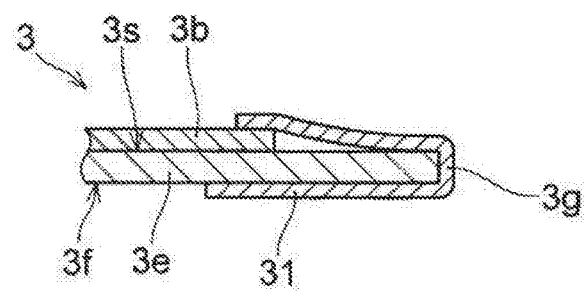
FIG. 5A shows a cross-sectional view of an example of the display apparatus according to Embodiment 1 in which relay wirings are provided at a display panel.

In the examples in FIGS. 1-4, driving elements 39 of the display panel 3 are connected to each of terminals constituting the first terminal group 31 via the through-hole conductor 3d as shown in FIGS. 2 and 3A. However, as shown in FIG. 5A, the plurality of driving elements 39 can be electrically connected to the first terminal group 31 via a plurality of relay wirings 3g passing through the side surface of the display panel 3. In this way, formation of the through-hole conductor 3d can be omitted. FIG. 5A shows the relay wirings 3g and the display panel 3 at a cross section corresponding to the cross section along the line II-II in FIG. 1. The plurality of relay wirings 3g extend, from a surface (the first surface 3f) of the display panel 3 that is to be directed to the supporting member 5, to an opposite surface (the second surface 3s) of the first surface 3f via a sideward part of the display panel 3. In this way, the display panel 3 can comprise the plural relay wirings 3g arranged in parallel which are formed separately from the display panel 3 using a conductive material and are adhered to the display panel 3.

The relay wiring 3g can be formed of an arbitrary metal material such as copper, aluminum, or nickel. The relay wirings 3g are adhered to the display panel 3 using an arbitrary adhesive such as an epoxy adhesive. In the example in FIG. 5A, end part of the relay wirings 3g on the side of the first surface 3f of the display panel 3 also constitutes each of terminals constituting the first terminal group 31. In this way, by integrally forming the first terminal group 31 with the relay wirings 3g, it can be possible to omit the process itself of providing some conductor on the first surface 3f of the display panel 3. However, unlike the example in FIG. 5A, the relay wirings 3g and each of terminals constituting the first terminal group 31 that is directly formed on the first surface 3f can be connected at the first surface 3f.

Figure 5B:
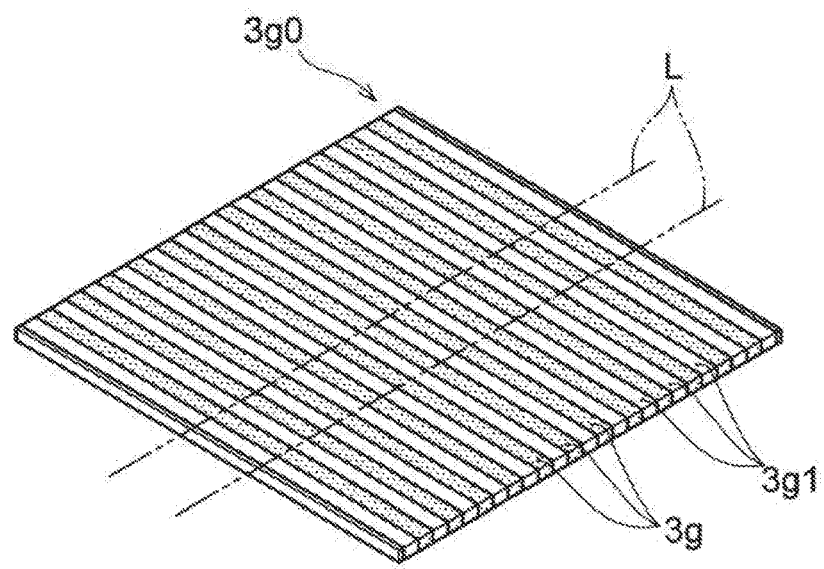
FIG. 5B shows a perspective view of one example of the relay wirings of the display apparatus according to Embodiment 1.

FIG. 5B shows an example of the plurality of relay wirings 3g. In the example in FIG. 5B, relay wirings each being one of the plurality of relay wirings 3g are coupled together with an insulating portion 3g1 and constitute a wiring board 3g0. The wiring board 3g0 is folded at two folding lines L shown with the chain double-dashed lines in FIG. 5B and is adhered to the display panel 3. Solder or a conductive adhesive can be used for connecting the relay wirings 3g and each terminal of the first terminal group 31 and connecting the relay wirings 3g and the wirings 3b (see FIG. 5A) of the display panel 3. The previously-described ACF can be also used. The insulating portion 3g1 can be formed of a polyimide resin or an epoxy resin, for example. The wiring board 3g0 shown in FIG. 5B can be formed in accordance with the following procedure, for example. First, the plurality of relay wirings 3g formed in parallel and coupled with a tie bar by etching a copper foil are prepared. A B-stage epoxy resin is coated or laminated on the plurality of parallel relay wirings 3g. Thereafter, the wiring board 3g0 can be formed by removing an unnecessary portion of the thermally hardened epoxy resin through grinding to expose the relay wirings 3g. Alternatively, masking with appropriate openings is made on a surface of a polyimide film, for example, and a plating film is formed within the openings by electroless plating, thereby, the wiring board 3g0 can be formed.

Figure 6:
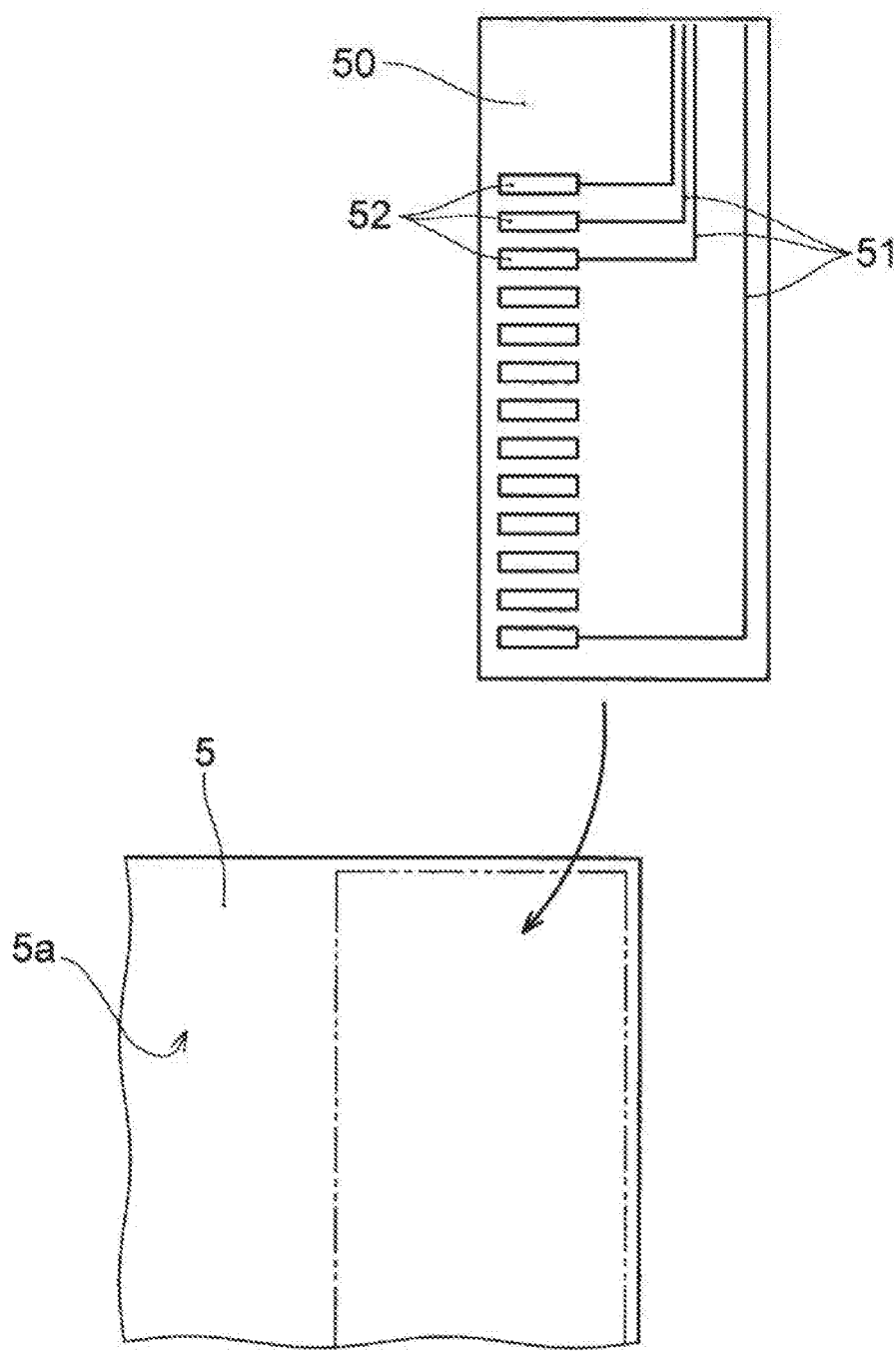
FIG. 6 shows one example of wirings formed at a base material separate from a supporting member in the display apparatus according to Embodiment 1.

In the example shown in FIGS. 1 to 4 previously referred to, the wirings 51 and the second terminal group 52 are directly formed on the surface 5a of the supporting member 5. However, as mentioned above, the supporting member 5 can comprise a very large member, such as a window glass of an automobile, compared to the display panel 3. In that case, it is not necessarily easy to form the wirings 51 on the supporting member 5 having such a large size. Accordingly, the wirings 51 and the second terminal group 52 can be formed on the base material 50 separate from the supporting member 5 as shown in FIG. 6 and the base material 50 can be adhered to the surface 5*a* of the supporting member 5. Forming the wirings 51 and the like by doing so can be sometimes easier than forming them on the supporting member 5. The wirings 51 and the second terminal group 52 are, for example, formed by patterning a metal foil made of copper or the like that is laminated on the base material 50 by etching or the like. The wirings 51 and the like can be also formed by performing electroless plating, sputtering, vapor deposition, or the like after appropriately masking the base material 50.

The base material 50 is a plate-like body or a filmy body formed using an arbitrary insulating material and can be, for example, a substrate formed mainly of an epoxy resin, or a polyimide film. In the case where the supporting member 5 is a glass plate such as a windshield of an automobile, it is preferable that the base material 50 be a transparent polyimide film so as to maintain light transmissivity. The base material 50 is adhered to the supporting member 5 using, for example, an adhesive. Although an arbitrary adhesive can be used as this adhesive, it is preferable to use the above-mentioned OCA as the adhesive when the supporting member 5 and the base material 50 have light transmissivity.

Figure 7A:
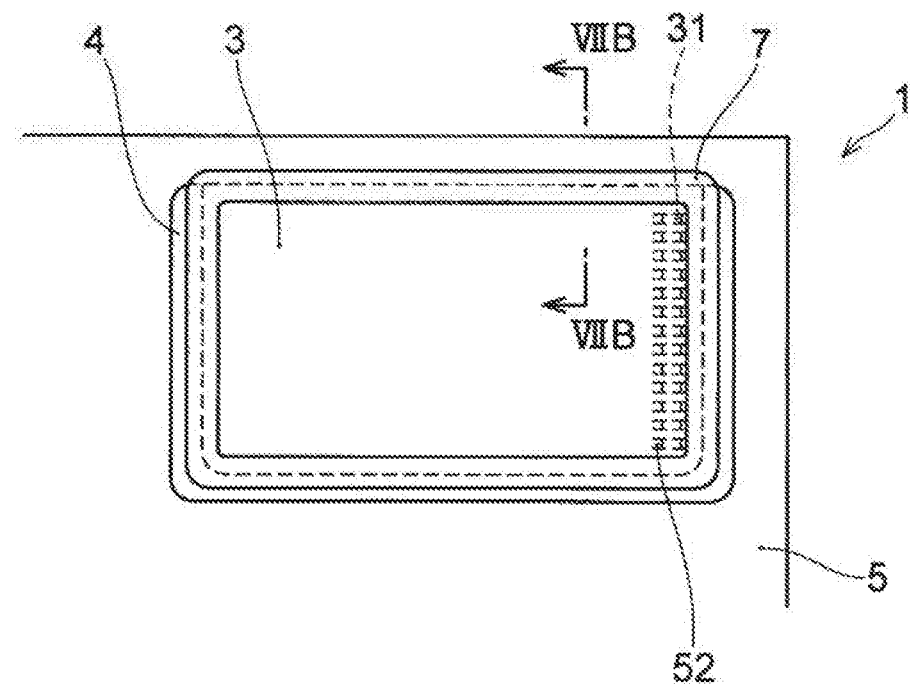

Deterioration of a display element constituting the display panel 3, particularly an organic element forming a light-emitting layer of an organic-EL display panel, easily progresses due to a contact with moisture. Moreover, when the connecting portion between the first terminal group 31 and the second terminal group 52 is exposed to moisture, a short-circuit failure can occur due to ion migration between neighboring terminals. Therefore, the interface between the display panel 3 and the holding member 4 is preferably covered with a sealing member 7 as shown in FIGS. 3A and 7A previously referred to, so that moisture does not enter the interior of the holding member 4 that surrounds the display panel 3. In this way, the gap between the display panel 3 and the holding member 4 is covered with the sealing member 7, so that, as a result, penetration of moisture from the interface between the display panel 3 and the holding member 4 is prevented. The sealing member 7 is, for example, a solidified substance of an epoxy resin, an acrylic resin, a silicone resin, or the like which is supplied to the interface between the display panel 3 and the holding member 4 by coating, for example. Moreover, the sealing member 7 can be an organic film formed using an epoxy resin, an acrylic resin, or a silicone resin or an inorganic film formed using aluminum or silicon nitride.

Figure 7B:
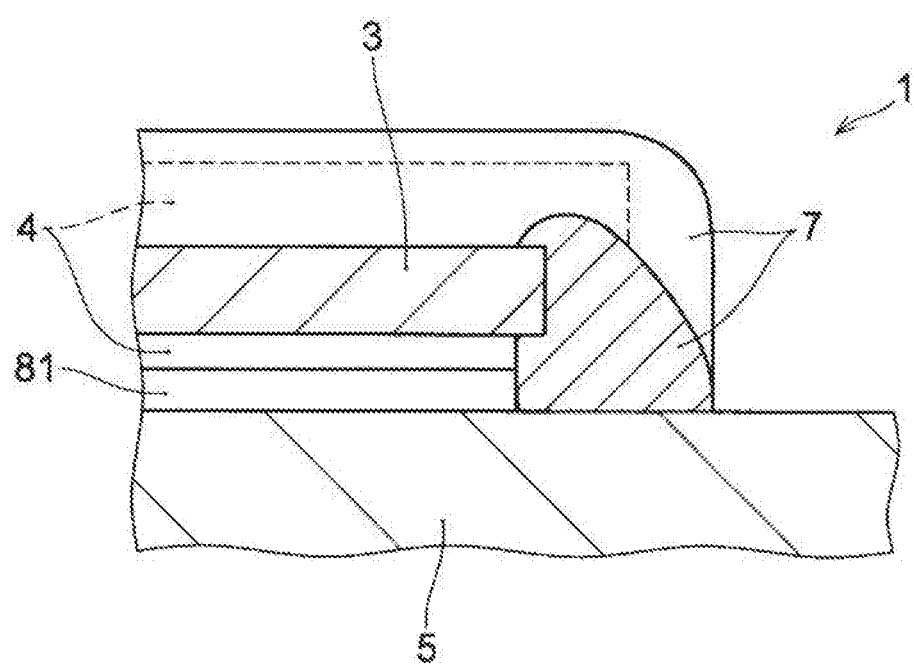
FIG. 7B shows an enlarged view of a cross section along a line VIIB-VIIB in FIG. 7.

In the example in FIG. 7A, the holding member 4 comprises a discontinuous portion as with the example in FIG. 1, and, therefore, the holding member 4 partially abuts an edge of the display panel 3. Thus, even when the interface between the holding member 4 and the display panel 3 is covered with the sealing member 7, moisture can penetrate between the display panel 3 and the supporting member 5 from an edge of the display panel 3 that does not abut the holding member 4. Thus, as shown in FIGS. 7A and 7B, the gap between the supporting member 5 and a portion of the edge of the display panel 3 that does not abut the holding member 4 is preferably covered using the sealing member 7. FIG. 7B shows an enlarged view of a cross section along a line VIIB-VIIB in FIG. 7A. As shown in FIG. 7A, the sealing member 7 is formed in a frame shape along an edge of the display panel 3 and over the entire periphery of the display panel 3. As a result, the space between the display panel 3 and the supporting member 5 is substantially sealed.

The sealing member 7 that covers the gap between the supporting member 5 and the portion of the display panel 3 that does not abut the holding member 4 can be a solidified substance of, for example, an epoxy resin painted, an organic film formed using, for example, an epoxy resin coated, or an inorganic film formed using silicon nitride, for example. The display panel 3 can be removed, as needed, from the supporting member 5 by a method such as dissolving the sealing member 7 that is provided only at a peripheral edge of the display panel 3 using an appropriate solvent. The display panel 3 can be removed from the supporting member 5 more easily relative to at least a case in which the entire display panel 3 is adhered to the supporting member 5.

Figure 8:
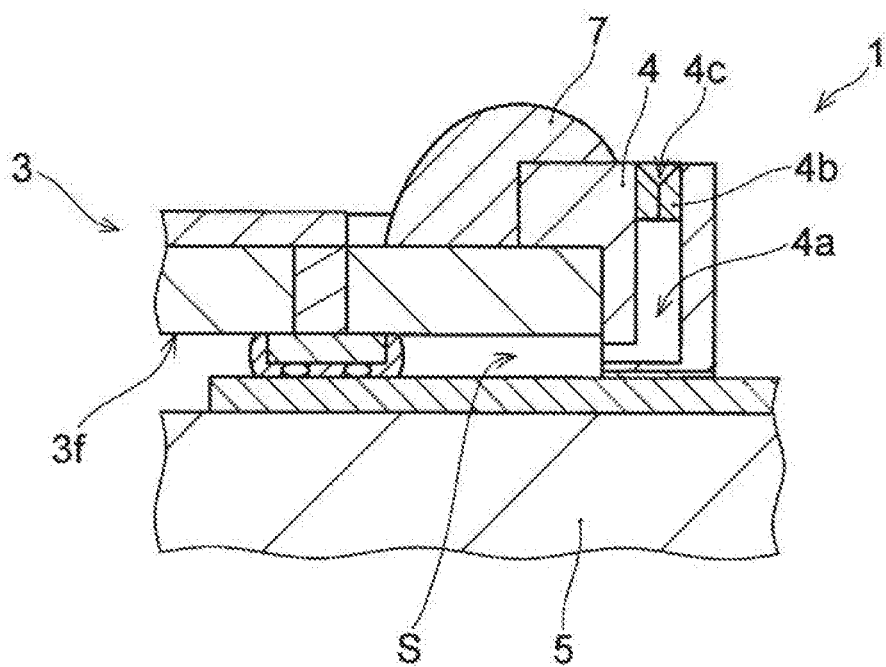
FIG. 8 shows another example of the holding member of the display apparatus according to Embodiment 1.

As shown in FIG. 7A, the space between the display panel 3 and the supporting member 5 is substantially sealed by the holding member 4 and the sealing member 7, so that penetration of moisture from the exterior of the display apparatus 1 is prevented with high probability. However, to prevent the first surface 3*f* of the display panel 3 from being exposed to moisture within air that exists between the display panel 3 and the supporting member 5 before the sealing member 7 is provided, air in the space between the display panel 3 and the supporting member 5 is preferably discharged. FIG. 8 shows an example of the display apparatus 1 that is suitable for discharging air as such in a cross-sectional view corresponding to FIG. 3A previously referred to. In other words, a through hole 4*a* communicating, from the exterior of the display apparatus 1, with a space S between the display panel 3 and the supporting member 5 is provided at the holding member 4, and a closure member 4*b* to close the through hole 4*a* is provided at the through hole 4*a*. The inner diameter of the through hole 4*a* is 0.5 mm or more and 1.0 mm or less, for example. In the display apparatus 1 shown in FIG. 8, after the sealing member 7 is formed, air in the space S is sucked out via the through hole 4*a*, thereby causing the space S to be in a substantially vacuum state, or at least causing moisture in the space S to decrease. As a result, deterioration of the display panel 3 owing to the influence of moisture within the space S can be prevented. Moreover, entrainment of air bubbles into the interface between the surface 5*a* of the supporting member 5 and the display panel 3 can be prevented.

In the example in FIG. 8, the through hole 4*a* comprises an opening on an inner wall surface of the holding member 4 and an upper surface (a surface opposite a surface directed to the supporting member 5) of the holding member 4 and has an L-shaped cross-sectional shape. The holding member 4 comprises the closure member 4*b*, in the through hole 4*a*, in the vicinity of the upper surface of the holding member 4. The through hole 4*a* can pass through the holding member 4 between an outer wall surface and an inner wall surface of the holding member 4. Moreover, a horizontal hole portion of the L-shaped through hole shown in FIG. 8 can be a groove provided on a surface, to be directed to the supporting member 5, of the holding member 4.

In the example in FIG. 8, the closure member 4*b* is an elastic body comprising a ventilation path 4*c* that penetrates the closure member 4*b* and the closure member 4*b* is press-fitted into the interior of the through hole 4*a*. The closure member 4*b* can be formed of a natural rubber, a synthetic rubber such as a butadiene rubber, or a silicone rubber, for example. The ventilation path 4*c* is normally closed with the surrounding closure member 4*b* by being press-fitted into the through hole 4*a*. When air in the interior of the space S is discharged, a thin tube material (not shown) such as a hollow needle is inserted into the ventilation path 4c while pushing aside the surrounding inner wall of the closure member 4b. Then, air in the interior of the space S is discharged using a pump (not shown) via the tube material inserted into the ventilation path 4c. The closure member 4b shown in FIG. 8 is merely one example, so that the closure member 4b can comprise a structure different from the example shown in FIG. 8. For example, the closure member 4b can be a lid material prepared such that attachment and/or detachment to/from the opening of the through hole 4a is possible. Moreover, the closure member 4b can be a check valve positioned inside the through hole 4a to close the through hole 4a by abutting a stepped portion provided at the inner wall of the through hole 4a when pulled to the space S that is brought to a negative pressure state.

In the example shown in each of the drawings previously referred to, the display panel 3 comprises the pixel forming region 3c on the second surface 3s, or, in other words, the surface to be directed to a viewer of the display apparatus 1. In other words, in the case where the display panel 3 is an organic-EL display apparatus, the display panel 3 exemplified in each drawing is a top emission type organic-EL display panel. However, the display panel 3 can be configured as a bottom emission type organic-EL display panel, and an example thereof is shown in FIG. 9.

Figure 9:
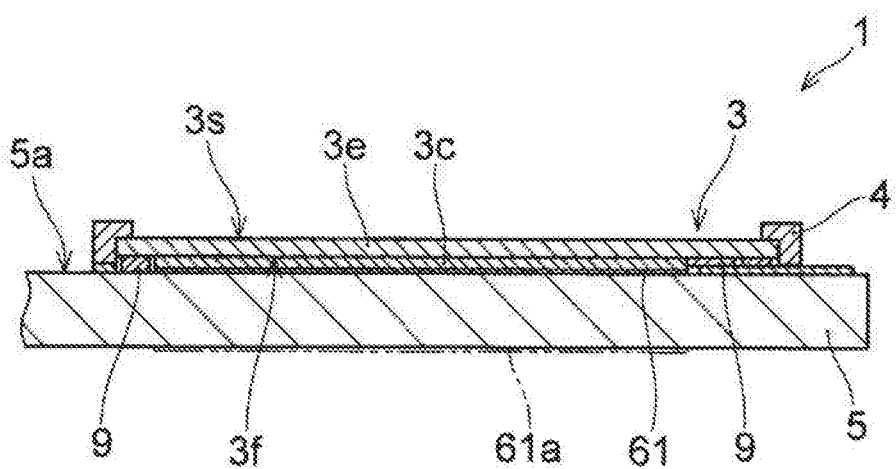
FIG. 9 shows a cross-sectional view of another example of the display apparatus according to Embodiment 1 of the present invention.

As shown in FIG. 9, the display panel 3 comprises the pixel forming region 3c on the surface (the first surface 3f) to be directed to the supporting member 5. In addition, the optical functional layer 61 is formed on the first surface 3f (more specifically, the surface of the pixel forming region 3c). As the optical functional layer 61 shown in FIG. 9, for example, either or both an ultraviolet-ray absorbing layer and an infrared-ray reflective layer can be formed, similar to the optical functional layer 61 described previously with reference to FIG. 2. In the example shown in FIG. 9, the pixel forming region 3c faces the supporting member 5. Accordingly, in the case where the supporting member 5 is a windshield of an automobile or the like, the organic elements (not shown) in the pixel forming region 3c are irradiated with sunlight including ultraviolet-rays and infrared-rays not passing through a substrate 3e constituting the display panel 3, unlike the example shown in FIG. 2. Therefore, it is particularly useful to provide the optical functional layer 61 on the first surface 3f of the display panel 3 in the example shown in FIG. 9. In the case where the display panel 3 is the bottom emission type organic-EL display panel exemplified in FIG. 9, the optical functional layer 61a can be formed on the supporting member 5 in addition to the optical functional layer 61 provided on the first surface 3f of the display panel 3, or instead of the optical functional layer 61. Further, although not shown, a protection film against a mechanical stress can be formed on the second surface 3s of the display panel 3.

In the example shown in FIG. 9, the display panel 3 comprises a stepped portion caused by the pixel forming region 3c on the surface (the first surface 3f) to be directed to the supporting member 5. In the example shown in FIG. 9, an auxiliary member 9 having a thickness corresponding to a height of the stepped portion is provided around the pixel forming region 3c between the supporting member 5 and the display panel 3. The display panel 3 is stably held on the surface 5a of the supporting member 5 by virtue of the auxiliary member 9. Further, the second surface 3s of the display panel 3 from which light is emitted can be positioned substantially parallel to the surface 5a of the supporting member 5.

The auxiliary member 9 can be provided continuously along the entire periphery of the pixel forming region 3c, or can be provided discontinuously in a belt like shape along each of sides of the pixel forming region 3c having a rectangular front shape. Alternatively, an arbitrary number of auxiliary members 9, each having a columnar shape, can be regularly or randomly positioned around the pixel forming region 3c. The thickness of the auxiliary member 9 can be a thickness substantially corresponding to the height of the stepped portion caused by the pixel forming region 3c, or can be greater than the thickness corresponding to the stepped portion. Although the auxiliary member 9 can be formed of an arbitrary material, the auxiliary member 9 is preferably formed of the same material as the material forming the holding member 4, at least a material having substantially the same thermal expansion coefficient. By doing so, the stress that can be applied to the display panel 3 when the ambient temperature changes can be reduced.

Figure 10:
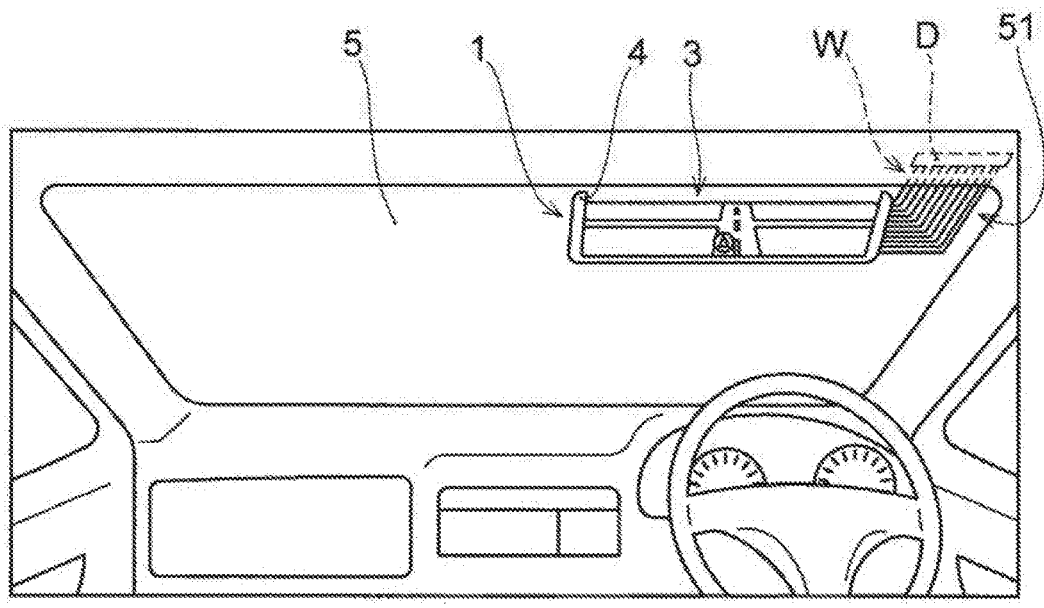
FIG. 10 shows an example of the display apparatus according to Embodiment 1, in which a windshield of an automobile constitutes the supporting member.

FIG. 10 shows an example of the present embodiment where the supporting member 5 is a windshield of an automobile. In other words, the display panel 3 is held by the holding member 4 on a surface, facing the vehicular compartment, of the windshield that serves as the supporting member 5. An image by a navigation system is displayed on the display panel 3. The display panel 3 can be held at an arbitrary position on the windshield serving as the supporting member 5. For example, the display panel 3 having a lateral width corresponding to the entire width of the windshield can be held in the vicinity of an upper edge or a lower edge of the windshield entirely in the vehicle width direction. In the case of the vicinity of the upper edge, the display panel 3 is desirably held within an area to be the upper 20% region of the projection image of the windshield projected onto the plane orthogonal to the back-and-forth direction of the automobile, as mentioned above. In the case of the vicinity of the lower edge, the display panel 3 is preferably held in a region within 150 mm from the lower edge. By doing so, the forward field of vision can be sufficiently secured, and it is possible to contribute to safe navigation.

In the example in FIG. 10, the wirings 51 formed on the windshield (the supporting member 5) extend toward the upper edge of the windshield. A driver D to generate a driving signal is positioned between the upholstery material at the ceiling part of the vehicular compartment and the roof of the automobile. The wirings 51 are connected, at the upper edge of the windshield, to conductive wires W connected to the driver D. In the case where the display apparatus 1 is provided in the vehicular compartment of an automobile in this manner, the wirings 51 connecting the display panel 3 and the driver D can be positioned in a state where the wirings 51 do not fluctuate due to vibration of the automobile and, further, along the windshield surface. It is considered that a neat impression be given to a person in the vehicular compartment.

Figure 11:
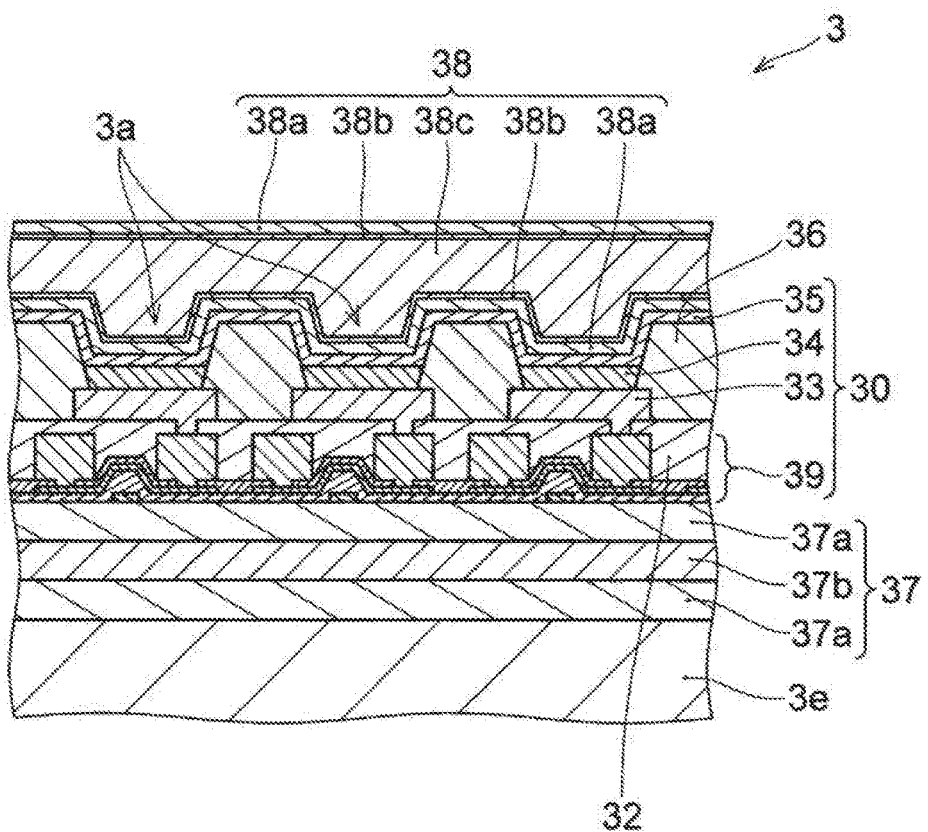
FIG. 11 schematically shows an enlarged cross-sectional view of one example of a structure of the display panel used for the display apparatus according to Embodiment 1.

FIG. 11 shows an exemplary cross-sectional structure of the top emission type organic-EL display panel, which can be used as the display panel 3 in the present embodiment. As shown in FIG. 11, the display panel 3 comprises a substrate 3e and a plurality of display elements 30 formed on the substrate 3e. The substrate 3e is, for example, a resin film formed using a polyimide resin, preferably a transparent polyimide resin, or a glass plate. Each display element 30 comprises a thin film transistor (TFT) functioning as the above-mentioned driving element 39, a first electrode 33 connected to the TFT, an organic layer 34 formed of an organic material vapor-deposited on the first electrode 33 so as to emit light, and a second electrode 35 formed on the organic layer 34. Each display element 30 is separated by a bank 36 formed using $SiO_2$ or the like. The first electrode 33 and the bank 36 are formed on a flattening layer 32 covering the TFT. Since the TFT, the first and second electrodes 33 and 35, the organic layer 34, the bank 36, and the flattening layer 32 can have common structures and common materials for them, detailed description thereof will be omitted.

In the example shown in FIG. 11, the display panel 3 comprises a first barrier layer 37 between the display element 30 and the substrate 3e, and a second barrier layer 38 on the display element 30. The first barrier layer 37 and the second barrier layer 38 are formed using a moisture impermeable material. The water vapor transmission rate of the first barrier layer 37 and the second barrier layer 38 is, for example, equal to or less than $1\times10^{-4}$ $g/m^2/day$. In the example shown in FIG. 11, the first barrier layer 37 is a multilayered layer comprising two silicon nitride layers 37a, and a silicon oxide layer 37b sandwiched between the two silicon nitride layers 37a. Further, the second barrier layer 38 has a five-layer structure comprising two silicon nitride layers 38a, two silicon oxide layers 38b, and an organic layer 38c. The organic layer 38c is formed using, for example, an epoxy resin or the like. The silicon oxide layers 38b and the organic layer 38c are not necessarily formed, and, instead of the silicon nitride layer 38a, a silicon nitride oxide layer having a high film-forming rate can be provided. Each of the first and second barrier layers 37 and 38 can be constituted as a single-layer, or can be a multi-layered layer that is different from the example shown in FIG. 11 in the number of layers, or can be formed using a material other than silicon nitride or silicon oxide.

Although not shown, the display panel 3 can be the liquid crystal display panel, as mentioned above. The liquid crystal display panel used as the display panel 3 in the display apparatus 1 can have structure and material of a common liquid crystal display panel including pixel electrodes and counter electrodes, alignment films, polarizing plates, liquid crystal layers and the like, and therefore detailed description thereof will be omitted.

[Method for Manufacturing Display Apparatus]

Figure 12:
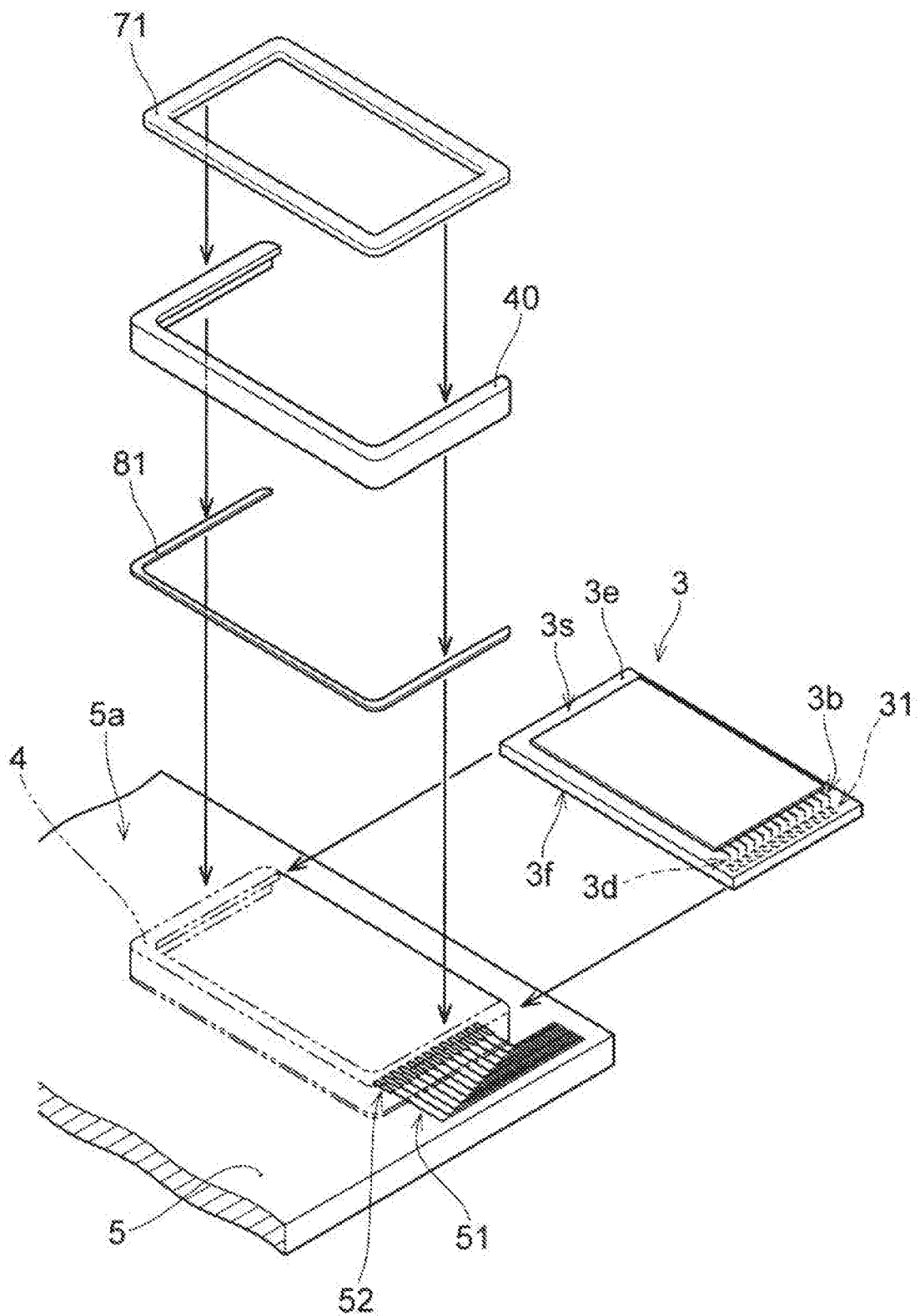
FIG. 12 shows one example of a method for manufacturing display apparatus according to Embodiment 2 of the present invention.

Next, a method for manufacturing display apparatus according to Embodiment 2 will be described with reference to attached drawings. FIG. 12 schematically shows a method for manufacturing display apparatus according to the present embodiment, taking the above-mentioned display apparatus 1, as an example, shown in FIGS. 1 to 4 referenced to in the explanation described above. The method for manufacturing display apparatus according to the present embodiment comprises forming the display panel 3 comprising the pixels 3a (see FIG. 1), the plurality of driving elements 39 (see FIG. 1) to drive the pixels 3a, and the first terminal group 31 electrically connected to the plurality of driving elements 39, and forming the plurality of wirings 51 and the second terminal group 52 connected to the plurality of wirings 51 on the surface 5a of the supporting member 5. The supporting member 5 comprises the surface 5a on which the display panel 3 is to be placed. The method for manufacturing display apparatus according to the present embodiment further comprises adhering a rod-shaped material 40 having a linear or curved shape (a curved shape in the example in FIG. 12) onto the surface 5a of the supporting member 5, thereby, providing a holding member 4 to hold the display panel 3 on the surface 5a, causing at least a portion of an edge of the display panel 3 to abut the rod-shaped material that constitutes the holding member 4, and placing the display panel 3 on the surface 5a of the supporting member 5. Then, placing the display panel 3 on the surface 5a of the supporting member 5 comprises placing the display panel 3 on the surface 5a while directing the first terminal group 31 to the surface 5a, and connecting each of terminals constituting the first terminal group 31 and each of terminals constituting the second terminal group 52. Next, the method will be described in more detail below.

First, formation of the display panel 3 will be described with reference to FIGS. 11 and 12. For example, an organic-EL display panel, a liquid crystal display panel, or the like is formed as the display panel 3. In the case where the organic-EL display panel is formed as the display panel 3, for example, the substrate 3e constituted by a polyimide film, a glass plate, or the like is prepared and the first terminal group 31 is formed on a surface (the first surface 3f) to be directed to the supporting member 5. Moreover, wirings 3b that electrically connect the driving elements 39 and the first terminal group 31 are formed on a surface (the second surface 3s) opposite the first surface 3f and through-hole conductors 3d that connect the wirings 3b and the first terminal group 31 are formed.

The first terminal group 31 and the wirings 3b can be formed, for example, after forming a mask layer comprising an appropriate aperture on the first surface 3f and the second surface 3s, using a material such as copper or nickel according to a sputtering method, a vapor-deposition method, a plating method, or the like. Preferably, a gold coating layer is further formed on the surface of the first terminal group 31 by plating or the like. The through-hole conductors 3d are formed by filling through holes with copper, nickel, or the like using the sputtering method, a vapor-deposition method, the plating method, or the like, wherein the through holes are formed on the substrate 3e by etching combined with photolithography or by irradiation with a $CO_2$ laser beam or a YAG laser beam, or the like. The through-hole conductors 3d are preferably formed simultaneously with either or both of the wirings 3b and a base layer of the first terminal group 31. When the previously-described relay wirings 3g are used, the through-hole conductors 3d and the first terminal group 31 do not necessarily need to be formed. Moreover, even when the bottom-emission type organic-EL display panel shown in FIG. 9 previously referred to is formed as the display panel 3, the through-hole conductors 3d do not necessarily need to be formed. The example of the method of forming the relay wirings 3g has already been explained with reference to FIG. 5B, so that repeated explanations will be omitted.

Further, a plurality of TFTs functioning as the driving elements 39 and organic-EL display elements (the display elements 30) comprising the organic layer 34 and the like are formed on the substrate 3e. The TFT is formed in such a manner that at least a gate terminal thereof is electrically connected to any one of terminals constituting the first terminal group 31. The organic layer 34 is formed on the first electrode 33 surrounded by the bank 36. Further, by forming the second electrodes 35 on the organic layer 34, the plurality of pixels 3a are formed. Further, preferably, between the substrate 3e and the display element 30, the first barrier layer 37 (the silicon oxide layer 37b, and the silicon nitride layers 37a provided on upper side and lower side of the silicon oxide layer 37b, in the example shown in FIG. 11) is formed using a moisture impermeable material. The silicon nitride layers 37a and the silicon oxide layers 37b are formed according to, for example, a plasma-enhanced chemical vapor deposition (PECVD) method, the sputtering method, or the like.

After the display elements 30 are formed, preferably, the second barrier layer 38 is formed using a moisture impermeable material on the display elements 30. In the example shown in FIG. 11, the silicon nitride layer 38a, the silicon oxide layer 38*b*, and the organic layer 38*c* are formed in order on the display elements 30. Additionally, the silicon oxide layer 38*b* and the silicon nitride layer 38*a* are formed. The silicon nitride layers 38*a* and the silicon oxide layers 38*b* are formed according to, for example, the PECVD method, the sputtering method, or the like. The organic layer 38*c* is formed by printing an acrylic resin or an epoxy resin, for example, using an inkjet printer.

Since the TFT constituting the driving element 39, the first and second electrodes 33 and 35, and the organic layer 34 can be formed according to an arbitrary method including a well-known method, detailed description thereof will be omitted. Further, in the case of forming the liquid crystal display panel as the display panel 3, each electrode, alignment films, polarizing plates, and liquid crystal layer, which constitute liquid crystal display elements, can be formed according to an arbitrary method including a well-known method. Accordingly, detailed description thereof will be omitted.

The formation of the display panel 3 can be performed on a dummy plate (not shown) constituted by a glass plate or the like, and the completed display panel 3 can be subsequently separated from the dummy plate. Then, a reinforcing film (not shown) constituted by a copper foil, a PET film, or the like can be adhered to the surface of the display panel 3 that is peeled off the dummy plate. In that case, the optical functional layer 61 shown in FIG. 2 referred to previously is preferably formed before pasting the reinforcing film.

For example, an optical functional film having an infrared-ray reflective function or an ultraviolet-ray absorbing function can be prepared as the optical functional layer 61, and this film can be adhered to the display panel 3 using an optically clear adhesive such as the above-mentioned OCA. However, the optical functional layer 61 can be directly formed on the display panel 3. For example, sputtering method, vacuum deposition method, PECVD method, or the like can be used. Preferably, by depositing the above-mentioned multi-layer film comprising magnesium fluoride or the like using any one of the above-mentioned methods, the optical functional layer 61 can be formed. The optical functional layer 61 exemplified in FIG. 9, referred to previously, can be formed using the sputtering method, the vacuum deposition method, the PECVD method, or the like in an arbitrary process before the display panel 3 is placed on the surface 5*a* of the supporting member 5.

Further, the protection film 62 exemplified in FIG. 2 is preferably formed before the display panel 3 is placed on the supporting member 5 at an arbitrary timing after the display elements 30 are formed. The formation of the protection film 62 is performed by, for example, coating of a fluororesin, or formation of a film comprising $SiO_2$ by PECVD, coating, sputtering, or the like. The protection film 62 can be formed by adhering a separately formed film.

The supporting member 5 comprising the surface 5*a* on which the display panel 3 is to be placed is prepared, and the wirings 51 and the second terminal group 52 are formed on the surface 5*a*. Arbitrary materials such as glass, a metal, and a synthetic resin can be used for the supporting member 5. The supporting member 5 can be prepared by processing the above-mentioned materials according to an arbitrary method, or an existing article can be provided as the supporting member 5. As mentioned above, for example, a glass plate that can be used as a casing applicable to various devices, a windowpane of a residence, a display case, or the like, or a windshield of an automobile or the like can be provided as the supporting member 5.

The wirings 51 and the second terminal group 52 are formed, for example, by screen printing using a conductive paste containing silver or the like and subsequently baking in an atmosphere of approximately 100 degrees Celsius to 200 degrees Celsius for approximately 5 to 15 minutes, and drying or by sputtering or vapor-deposition using copper, titanium, aluminum, ITO, IZO, or the like. Preferably, the wirings 51 and a base layer of the second terminal group 52 are simultaneously and integrally formed, and a gold coating layer is formed by plating on (the surface of) the base layer of the second terminal group 52. Further, on the separate base material 50 shown in FIG. 6, referred to previously, the wirings 51 are formed by, electroless plating, or etching of a metal foil, or the like and the base material 50 can be adhered to the supporting member 5 preferably using, for example, OCA.

Although not shown in FIG. 12, the optical functional layer 61*a* indicated by the chain double-dashed line in FIG. 2, referred to previously, can be formed in preparing the supporting member 5 or after the formation of the wirings 51 and the like, or can be formed after the placement of the display panel 3 on the supporting member 5. The optical functional layer 61*a* can be formed, for example, by the same method as the formation method of the optical functional layer 61 described previously.

The rod-shaped material 40 is prepared by appropriately processing a material such as a synthetic resin or a natural resin, and the holding member 4 is provided by adhering the rod-shaped material 40 onto the surface 5*a* of the supporting member 5. The rod-shaped material 40 is formed using machining of materials, press processing or molding using a die manufactured appropriately so as to have a linear or curved shape. While the holding member 4 has a so-called U-shape that has a discontinuous portion at one side of a frame-like plane shape in the example in FIG. 12, the holding member 4 can be a frame body not having the discontinuous portion. Moreover, the previously-described through hole 4*a* (see FIG. 8) can be formed at the rod-shaped material 40. The holding member 4 having a desired arbitrary shape and having the through hole 4*a* can be formed by appropriately manufacturing a die used in forming the rod-shaped material 40. When the through hole 4*a* is formed, the closure member 4*b* is provided by press-fitting a plug formed with an arbitrary rubber into the through hole 4*a*, or setting a check valve into the through hole 4*a*.

The U-shaped holding member 4 is disposed at a position surrounding a proper placement position of the display panel 3. Although not shown, one, preferably two or more projections or concavities can be provided on the surface of the rod-shaped material 40 to be directed to the supporting member 5, and at the position corresponding to the projection or the concavity, a concavity or a projection can be formed on the surface 5*a* of the supporting member 5. Then, by coupling a pair of (preferably two pairs or more of) projection and concavity, positioning of the holding member 4 can be performed. In FIG. 12, the holding member 4 is adhered to the surface 5*a* of the supporting member 5 using the adhesive 81. If necessary, heating is performed to harden the adhesive 81. The adhesive 81 can be applied to either or both of the bonding surface of the holding member 4 and the surface 5*a* of the supporting member 5, or can be placed between the holding member 4 and the supporting member 5 after having being molded into a frame-like sheet shape, as shown in FIG. 12.

At least a portion of an edge of the display panel 3 and the holding member 4 are engaged. In the example in FIG. 12, three sides of the display panel 3 having a rectangular plane shape are engaged with the holding member 4. Moreover, in the example in FIG. 12, the display panel 3 is moved from a discontinuous portion of the U-shaped holding member 4 to the interior of the U-shape of the holding member 4, and, in conjunction therewith, the three sides of the display panel 3 abut on and engage with a wall surface which faces the interior of the U-shape of the holding member 4.

The display panel 3 is placed on the surface 5*a* with the first terminal group 31 being directed to the surface 5*a* of the supporting member 5. The display panel 3 is placed at a position at which each of terminals constituting the first terminal group 31 faces each of terminals constituting the second terminal group 52. Then, each of terminals constituting the first terminal group 31 and each of terminals constituting the second terminal group 52 are connected using the ACF described above, for example.

In FIG. 12, the display panel 3 is inserted into the interior of the U-shape of the holding member 4 adhering to the surface 5*a* of the supporting member 5, thereby, the display panel 3 is engaged with the holding member 4, and, together with completion of the insertion, the display panel 3 is placed at a given position on the surface 5*a*. However, the display panel 3 can be engaged with the holding member 4 before being adhered to the supporting member 5 (the rod-shaped material 40), and can be placed on the supporting member 5 together with the rod-shaped material 40. For example, in the frame-like holding member 4 not having a discontinuous portion, it is difficult to fit the display panel 3 into the interior of the frame-like holding member 4 after the holding member 4 is adhered to the supporting member 5. Therefore, the display panel 3 is engaged with the holding member 4 such that both of them overlap with each other in the thickness direction of the display panel 3 before adhering of the holding member to the supporting member 5. Moreover, the display panel 3 can be placed on the supporting member 5 prior to adhering of the holding member 4 on the supporting member 5, then, the holding member 4 can be adhered to the supporting member 5 and engaged with the display panel 3.

Figure 13:
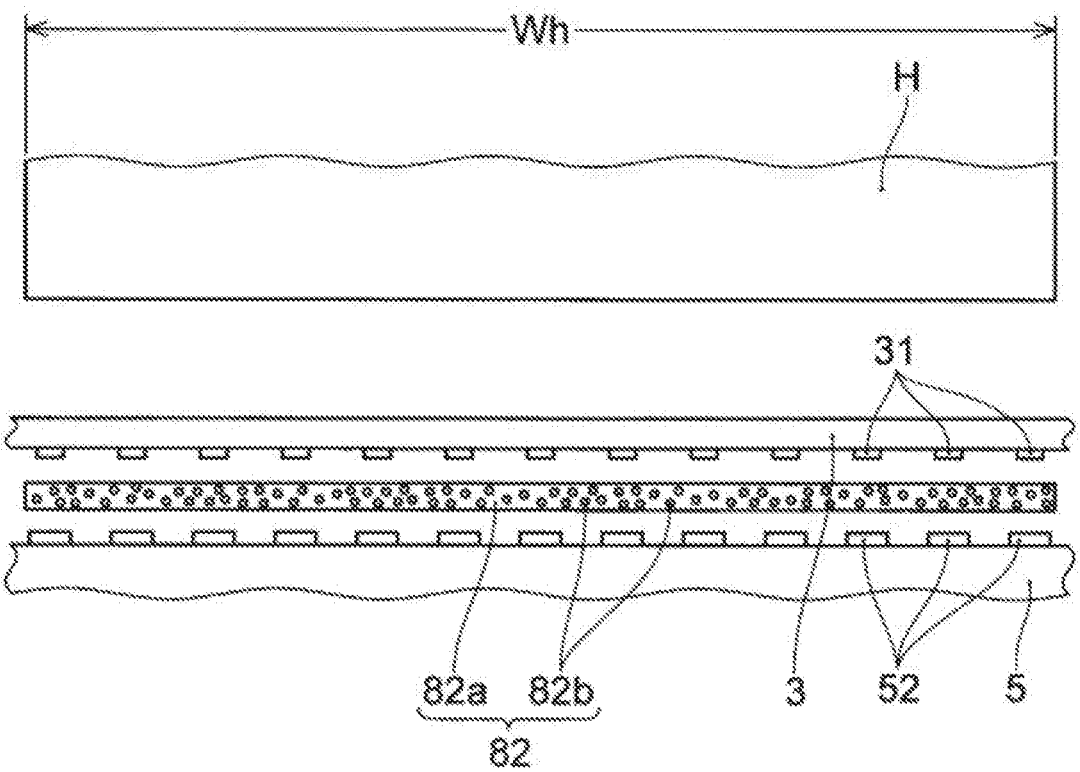
FIG. 13 shows one example of a connection process between a first terminal group and a second terminal group of the method for manufacturing display apparatus according to Embodiment 2.

FIG. 13 shows an exemplary process of connecting each of terminals constituting the first terminal group 31 and each of terminals constituting the second terminal group 52, using the ACF. The connection of each terminal of these two terminal groups is construed to be not limited to the method using the ACF shown in FIG. 13. However, the method using the ACF is preferable in that each of terminals disposed at the narrow pitch can be appropriately connected to each terminal of the opposite terminal group while suppressing short circuit failures. As shown in FIG. 13, between the first terminal group 31 and the second terminal group 52, the ACF is disposed as the connecting means 82 for both. The first terminal group 31 and the second terminal group 52 are pressed against each other and heated in a state where the ACF is interposed between them. For example, the pressing and the heating are performed at the pressure of approximately 2 MPa to 4 MPa and at the temperature of approximately 170 degrees Celsius to 200 degrees Celsius for approximately 5 seconds to 15 seconds.

In FIG. 13, the display panel 3 is pressed toward the supporting member 5 that is placed on a stage (not shown) by a heater block H. The heater block H preferably has a width Wh (a length of the heater block H in a direction parallel to the arrangement direction of each terminal of the first terminal group 31 and the second terminal group 52) which is longer than the entire length in the arrangement direction of each terminal of the first terminal group 31 and the second terminal group 52. The ACF is pressurized between the display panel 3 and the supporting member 5, thereby, neighboring conductive particles 82*b* make contact with each other or the conductive particle 82*b* and each terminal make contact, in the thickness direction of the ACF. As a result, opposite terminals in the first terminal group 31 and the second terminal group 52 are electrically connected. On the other hand, terminals neighboring in the direction of arrangement of each terminal are not connected.

Moreover, the thermosetting resin portion 82*a* once softens when heated, enters between neighboring terminals in the arrangement direction of each terminal, and hardens thereafter. The state of electrical connection between the opposite terminals is maintained, and it is ensured that neighboring terminals in the arrangement direction are insulated between respective terminals. Instead of the heater block H, a heater-equipped pressurizing roller (not shown) can be used, and each of terminals constituting the first terminal group 31 and the second terminal group 52 can be pressurized and heated in order in an arrangement direction of terminals of each terminal group. After undergoing the above-described processes, the display apparatus 1 shown in FIGS. 1 to 4 will be completed. The display panel 3 are adhered to the supporting member 5 only at the first terminal group 31, the second terminal group 52 and their surroundings. Therefore, by dissolving the connecting means 82 such as the ACF using a solvent or by mechanically rupturing the connecting means 82, it is possible to remove the display panel 3 from the supporting member 5 relatively easily.

The method for manufacturing display apparatus according to the present embodiment, as shown in FIGS. 2 and 7A previously referred to, can further comprise covering a gap between the display panel 3 and the holding member 4 by supplying a resin to a gap between the display panel 3 and the holding member 4, or providing an organic film or an inorganic film so as to cover the gap. Moreover, as shown in FIGS. 7A and 7B, the method for manufacturing display apparatus according to the present embodiment can comprise providing a sealing member 7 that covers a gap between the supporting member 5 and a portion, not abutting the holding member 4, of an edge of the display panel 3. While the sealing member 7 can be provided with an arbitrary method, the sealing member 7 is provided, for example, by supplying a resin to the gap, or providing an organic film or an inorganic film so as to cover the gap.

FIG. 12 shows a film-like member 71 having a frame-like shape that can serve as the sealing member 7 shown in FIG. 7A and the like. In the example in FIG. 12, the gap between the display panel 3 and the holding member 4 is covered with the film-like member 71, the gap between the supporting member 5 and the portion of the edge of the display panel 3 that does not abut the holding member 4 is covered with the film-like member 71, and the sealing member 7 that covers these gaps is provided. In other words, in the example in FIG. 12, the gap between the display panel 3 and the holding member 4 and the gap between the supporting member 5 and the portion of the edge of the display panel 3 that does not abut the holding member 4 are covered substantially simultaneously.

As the film-like member 71, an organic film formed using an epoxy resin, an acrylic resin, or a silicone resin and an inorganic film formed with vapor deposition of aluminum or sputtering of silicon nitride are exemplified. The film-like member 71 constituted by the above-mentioned organic film or inorganic film is arranged so as to cover the gaps between the display panel 3 and both of the holding member 4 and the supporting member 5, and tightly adheres to the display panel 3, the holding member 4, and the supporting member 5 by undergoing heating. As a result, the gaps between the display panel 3 and both of the holding member 4 and the supporting member 5 are sealed by the sealing member 7 that comprises the inorganic film or organic film. The sealing member 7 can be provided by supplying an unsolidified epoxy resin or silicone resin to the gap between the display panel 3 and the holding member 4 or the supporting member 5 using a dispenser and solidifying the resin by heat or ultraviolet rays. The sealing member 7 suppresses penetration of moisture that reaches the connecting portion between the first terminal group 31 and the second terminal group 52. The gap between the display panel 3 and the holding member 4 and the gap between the display panel 3 and the supporting member 5 can be covered separately.

In this way, the gaps between the display panel 3 and both of the holding member 4 and the supporting member 5 are covered using the sealing member 7, thereby, the space S (see FIG. 8) between the display panel 3 and the supporting member 5 is substantially sealed by the holding member 4 and the sealing member 7. Then, when the previously-described through hole 4a (see FIG. 8) is formed at the holding member 4, the method for manufacturing display apparatus according to the present embodiment can further comprise sucking out air in the space S via the through hole 4a. In this way, the space S can be brought to a substantially vacuum state, or at least moisture within the space S can be reduced, and it is possible to suppress deterioration of the display panel 3 due to the influence of moisture within the space S. Moreover, entrainment of air bubbles into the interface between the display panel 3 and the surface 5a of the supporting member 5 can be prevented. The air in the space S is sucked out using an arbitrary suction means such as a suction pump. Re-inflow of air into the space S after sucking out is prevented by the closure member 4b (see FIG. 8).

SUMMARY (1) A display apparatus according to one embodiment of the present invention comprises: a display panel comprising a plurality of driving elements to drive pixels and a first terminal group electrically connected to the driving elements; a supporting member comprising a surface on which the display panel is to be placed and comprising, on the surface, a plurality of wirings and a second terminal group connected to the plurality of wirings; and a holding member provided along an edge of the display panel using a rod-shaped material having a linear or curved shape to hold the display panel at a given position on the surface of the supporting member, wherein the first terminal group is provided on a surface of the display panel to be directed to the supporting member; and the display panel is placed on the surface of the supporting member, and each of terminals constituting the first terminal group is connected to each of terminals constituting the second terminal.

According to the above-mentioned configuration of (1), a display panel or a supporting member can be easily reused in the display apparatus or another display apparatus. Moreover, the means for transmitting signals to the display panel, such as wirings, can be provided without impairing aesthetic appearance of the display apparatus.

(2) In the display apparatus according to (1) described above, the supporting member can comprise a window glass of a vehicle. In this case, it is possible to provide the display apparatus comprising the wiring that is unlikely to swing against vibrations of a vehicle and accordingly unlikely to spoil the view.

(3) In the display apparatus according to (2) described above, the supporting member can comprise a windshield of an automobile and the plurality of wirings can be provided within an area to be an upper 20% region of a projected image of the windshield projected on a plane orthogonal to the back-and-forth direction of the automobile. In this case, the field of vision forward at the time of driving can be secured sufficiently, contributing to safe navigation.

(4) In the display apparatus according to (3) described above, the windshield can be exposed in between each of the plurality of wirings. In this case, the forward field of vision during driving can be sufficiently secured, and it is possible to contribute to safe navigation.

(5) In the display apparatus according to any one of (1) to (4) described above, the wirings and the second terminal group can be formed on a base material separate from the supporting member, and the base material can be adhered to the surface of the supporting member. In this case, the wirings and the second terminal group can be easily formed compared to a case where they are formed on the supporting member.

(6) In the display apparatus according to any one of (1) to (5) described above, a gap between the display panel and the holding member can be covered with a resinous solidified substance, an organic film, or an inorganic film. In this way, it is possible to prevent penetration of moisture penetrating toward a portion connecting the first terminal group and the second terminal group and an interface between the supporting member and the display panel.

(7) In the display apparatus according to any one of (1) to (6) described above, the holding member can partially abut the edge of the display panel and a gap between the supporting member and a portion of the edge of the display panel can be covered using a sealing member comprising a resinous solidified substance, an organic film, or an inorganic film, the portion of the edge of the display panel being a portion not abutting the holding member. In this way, penetration of moisture from an edge of the display panel that does not abut the holding member can be prevented.

(8) In the display apparatus according to (7) described above, a space between the display panel and the supporting member can be substantially sealed by the holding member and the sealing member; a through hole communicating with the space can be provided at the holding member; and a closure member to close the through hole can be provided at the through hole. In this case, air in the space between the display panel and the supporting member can be sucked out from the exterior via the through hole and deterioration of the display panel due to the influence of moisture within the space can be suppressed.

(9) In the display apparatus according to any one of (1) to (8) described above, either or both of an ultraviolet-ray absorbing layer and an infrared-ray reflective layer can be formed on a surface of the display panel to be directed to the supporting member. In this case, deterioration of the display panel due to heat and/or ultraviolet rays can be suppressed.

(10) In the display apparatus according to any one of (1) to (9) described above, the display panel can comprise a stepped portion caused by a pixel forming region on a surface to be directed to the supporting member; and an auxiliary member having a thickness corresponding to a height of the stepped portion can be provided around the pixel forming region between the supporting member and the display panel. In this case, the display panel is stably held on the supporting member.

(11) In the display apparatus according to any one of (1) to (10) described above, a protection film against a mechanical stress can be formed on a display surface of the display panel. In this way, it is possible to protect the display panel from a mechanical stress.

(12) In the display apparatus according to any one of (1) to (11) described above, the display panel can further comprise a plurality of relay wirings extending, from a surface to be directed to the supporting member, to an opposite surface of the surface to be directed to the supporting member via a sideward part of the display panel; and the plurality of driving elements can be electrically connected to the first terminal group via the plurality of relay wirings. In this way, the structure of the display panel itself can be made simple and manufacturing of the display panel can be simplified.

(13) In the display apparatus according to any one of (1) to (12) described above, the display panel can have a rectangular front shape; each of terminals constituting the first terminal group can be arranged along one side of the display panel; the holding member can be a frame body comprising a discontinuous portion at a portion of an entire rectangular shape; and in the holding member, a portion to be a side opposite to a side abutting the one side of the display panel can be the discontinuous portion. In this way, even when attachment and/or detachment of the display panel to/from the holding member is repeated, friction of each terminal in the first and the second terminal groups can be suppressed, and it is possible to maintain a proper connection state.

(14) A method for manufacturing display apparatus according to another embodiment of the present invention comprises: forming a display panel comprising pixels, a plurality of driving elements to drive the pixels, and a first terminal group electrically connected to the plurality of driving elements; forming a plurality of wirings and a second terminal group connected to the plurality of wirings on a surface of a supporting member, wherein the supporting member comprises the surface on which the display panel is to be placed; providing a holding member to hold the display panel on the surface, by adhering a rod-shaped material having a linear or curved shape onto the surface of the supporting member; causing at least a portion of an edge of the display panel to abut the rod-shaped material; and placing the display panel on the surface of the supporting member, wherein placing the display panel on the surface of the supporting member comprises placing the display panel on the surface while directing the first terminal group to the surface, and connecting each of terminals constituting the first terminal group and each of terminals constituting the second terminal group.

According to the above-mentioned configuration of (14), it is possible to easily manufacture the display apparatus in which reusing constituent elements is easy, the display panel is properly positioned, and the means for transmitting signals to the display panel is provided without impairing aesthetic appearance of the display apparatus.

(15) The method for manufacturing display apparatus according to (14) described above can further comprise covering a gap between the display panel and the holding member by supplying a resin to a gap between the display panel and the holding member or by providing an organic film or an inorganic film so as to cover the gap between the display panel and the holding member. In this way, penetration of moisture such as to reach a portion connecting the first terminal group and the second terminal group is suppressed.

(16) The method for manufacturing display apparatus according to (14) or (15) described above can further comprise providing a sealing member to cover a gap between the supporting member and a portion, not abutting the holding member, of an edge of the display panel by supplying a resin to the gap or by providing an organic film or an inorganic film so as to cover the gap. In this case, penetration of moisture such as to reach a portion connecting the first terminal group and the second terminal group is suppressed.

(17) The method for manufacturing display apparatus according to (16) described above can further comprise: forming a through hole at the rod-shaped material; substantially sealing a space between the display panel and the supporting member with the holding member and the sealing member; and sucking out air in the space via the through hole. In this way, it is possible to suppress deterioration of the display panel due to the influence of moisture within the space.

DESCRIPTION OF REFERENCE NUMERALS 1 display apparatus
3 display panel
3a pixel
3c pixel forming region
3g relay wiring
31 first terminal group
33 first electrode
39 driving element (TFT)
4 holding member
40 rod-shaped material
4a through hole
4b closure member
5 supporting member
50 base material
51 wiring
52 second terminal group
5a surface
61, 61a optical functional layer
62 protection film
7 sealing member
82 connecting means (ACF)
9 auxiliary member

The invention claimed is:
1. A display apparatus comprising:
a display panel comprising a plurality of driving elements to drive pixels and a first terminal group electrically connected to the driving elements;
a supporting member comprising a surface on which the display panel is to be placed and comprising, on the surface, a plurality of wirings and a second terminal group connected to the plurality of wirings; and
a holding member provided along an edge of the display panel using a rod-shaped material having a linear or curved shape to hold the display panel at a given position on the surface of the supporting member, wherein:
the first terminal group is provided on a surface of the display panel to be directed to the supporting member;
the display panel is placed on the surface of the supporting member, and each of terminals constituting the first terminal group is connected to each of terminals constituting the second terminal group;
the wirings and the second terminal group are formed on a base material separate from the supporting member; and the base material is a plate-like body having light transmissivity or a filmy body having light transmissivity, and the base material is adhered to the surface of the supporting member.

2. The display apparatus according to claim 1, wherein the supporting member and the wirings are formed using a material having light transmissivity.

3. The display apparatus according to claim 1, wherein:
the holding member partially abuts the edge of the display panel; and
a gap between the supporting member and a portion of the edge of the display panel is covered using a sealing member comprising an inorganic film, the portion of the edge of the display panel being a portion not abutting the holding member.

4. The display apparatus according to claim 3, wherein the sealing member is formed in a frame shape over an entire periphery of the display panel.

5. The display apparatus according to claim 1, wherein:
the display panel further comprises a plurality of relay wirings extending, from a surface to be directed to the supporting member, to an opposite surface of the surface to be directed to the supporting member via a sideward part of the display panel; and
the plurality of driving elements is electrically connected to the first terminal group via the plurality of relay wirings.

6. A display apparatus comprising:
a display panel comprising a plurality of driving elements to drive pixels and a first terminal group electrically connected to the driving elements;
a supporting member comprising a surface on which the display panel is to be placed and comprising, on the surface, a plurality of wirings and a second terminal group connected to the plurality of wirings; and
a holding member provided along an edge of the display panel using a rod-shaped material having a linear or curved shape to hold the display panel at a given position on the surface of the supporting member, wherein:
the first terminal group is provided on a surface of the display panel to be directed to the supporting member;
the display panel is placed on the surface of the supporting member, and each of terminals constituting the first terminal group is connected to each of terminals constituting the second terminal group; and
the supporting member and the wirings are formed using a material having light transmissivity.

7. The display apparatus according to claim 6, wherein:
the holding member partially abuts the edge of the display panel; and
a gap between the supporting member and a portion of the edge of the display panel is covered using a sealing member comprising an inorganic film, the portion of the edge of the display panel being a portion not abutting the holding member.

8. The display apparatus according to claim 7, wherein the sealing member is formed in a frame shape over an entire periphery of the display panel.

9. The display apparatus according to claim 6, wherein:
the display panel further comprises a plurality of relay wirings extending, from a surface to be directed to the supporting member, to an opposite surface of the surface to be directed to the supporting member via a sideward part of the display panel; and
the plurality of driving elements is electrically connected to the first terminal group via the plurality of relay wirings.

10. A display apparatus comprising:
a display panel comprising a plurality of driving elements to drive pixels and a first terminal group electrically connected to the driving elements;
a supporting member comprising a surface on which the display panel is to be placed and comprising, on the surface, a plurality of wirings and a second terminal group connected to the plurality of wirings; and
a holding member provided along an edge of the display panel using a rod-shaped material having a linear or curved shape to hold the display panel at a given position on the surface of the supporting member, wherein:
the first terminal group is provided on a surface of the display panel to be directed to the supporting member;
the display panel is placed on the surface of the supporting member, and each of terminals constituting the first terminal group is connected to each of terminals constituting the second terminal group;
the plurality of driving elements is provided on a surface of the display panel being opposite to the surface of the display panel to be directed to the supporting member; and
the first terminal group is electrically connected to the plurality of driving elements via a through-hole conductor being formed at the display panel.

* * * * *